United States Patent [19]

Leyde

[11] 4,064,485
[45] Dec. 20, 1977

[54] DIGITAL LOAD CONTROL CIRCUIT AND METHOD FOR POWER MONITORING AND LIMITING SYSTEM

[75] Inventor: Warren L. Leyde, Seattle, Wash.

[73] Assignee: Pacific Technology, Inc., Renton, Wash.

[21] Appl. No.: 707,564

[22] Filed: July 22, 1976

[51] Int. Cl.² .............. H04Q 9/00; H02J 13/00; G06F 15/56

[52] U.S. Cl. .................. 340/147 R; 307/39; 364/492

[58] Field of Search ............ 340/409, 419, 147 R, 340/150, 151, 152; 235/151.21, 151.2, 151.1; 322/8, 25, 36; 323/1, 2, 66; 307/31, 34, 35, 38, 126, 140, 152

[56] References Cited

U.S. PATENT DOCUMENTS

| | | | |
|---|---|---|---|
| 3,339,079 | 8/1967 | Kessler | 307/29 |
| 3,714,453 | 1/1973 | Delisle et al. | 307/39 |
| 3,789,201 | 1/1974 | Carpenter et al. | 235/151.21 |
| 3,842,249 | 10/1974 | Geyer et al. | 235/151.21 |
| 3,872,286 | 3/1975 | Putman | 235/151.21 |
| 3,906,242 | 9/1975 | Stevenson | 235/151.21 X |

Primary Examiner—Donald J. Yusko
Attorney, Agent, or Firm—Christensen, O'Connor, Garrison & Havelka

[57] ABSTRACT

To maintain power consumption within predetermined limits, the ON/OFF states of a plurality of electrical loads are controlled by a digital load control circuit that forms part of a closed-loop control system. The power consumed by the ON loads is monitored and compared with a reference and in response to such comparison command signals are produced that instruct the digital circuit to add or shed loads as required, to increase or decrease, respectively, the power consumption. Inputs to the load-control circuit are in the form of one or more add or shed command pulses wherein the former instructs the circuit to add a load, and the latter instructs the circuit to shed a load. To execute these commands, the load-control circuit includes a reversible, recycling address generator that successively addresses a bank of addressable latches, one for controlling the ON/OFF state of each load. As the latches are successively addressed, logic circuitry operates to detect a concurrence of an add command and an OFF load state at the addressed latch, or a concurrence of a shed command and an ON load state at the addressed latch. Detection of the former set of conditions causes the then addressed latch to be switched from its load OFF state to its ON state and detection of the latter set of conditions causes the then addressed latch to be switched from its load ON state to its OFF state. Various embodiments of the foregoing are disclosed including circuitry for selectively dividing the plurality of loads into two different groups, one of which is a fixed priority group wherein the loads thereof are added and shed in a fixed order, and the other of which is a rotate group wherein the order that the loads are added and shed is rotated so that all of the loads of such group equally share the available ON time; and circuitry for selecting a limit to the total number of rotate loads that can be ON at any given time and a limit to the number of such loads that can be OFF at any given time.

19 Claims, 10 Drawing Figures

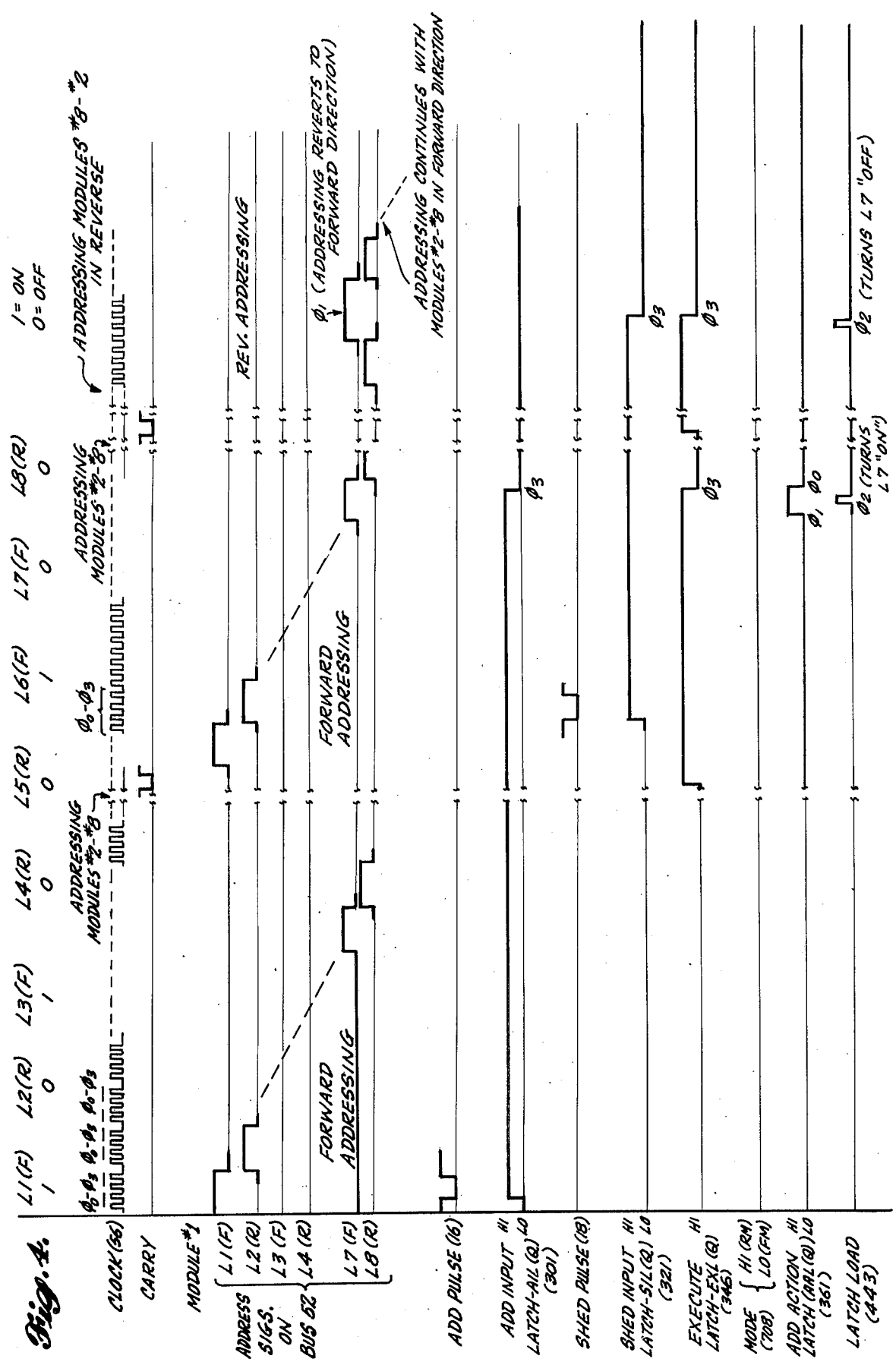

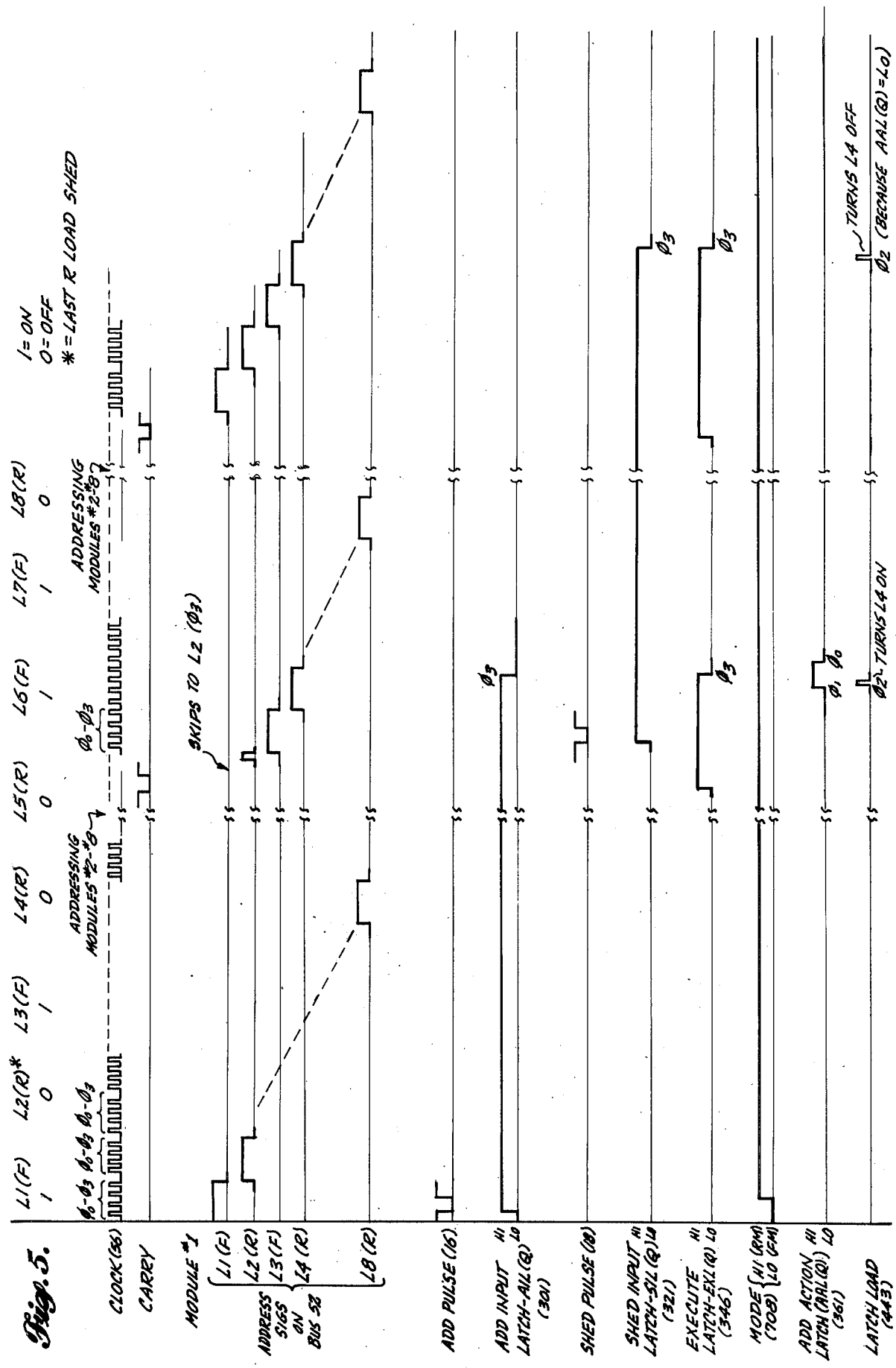

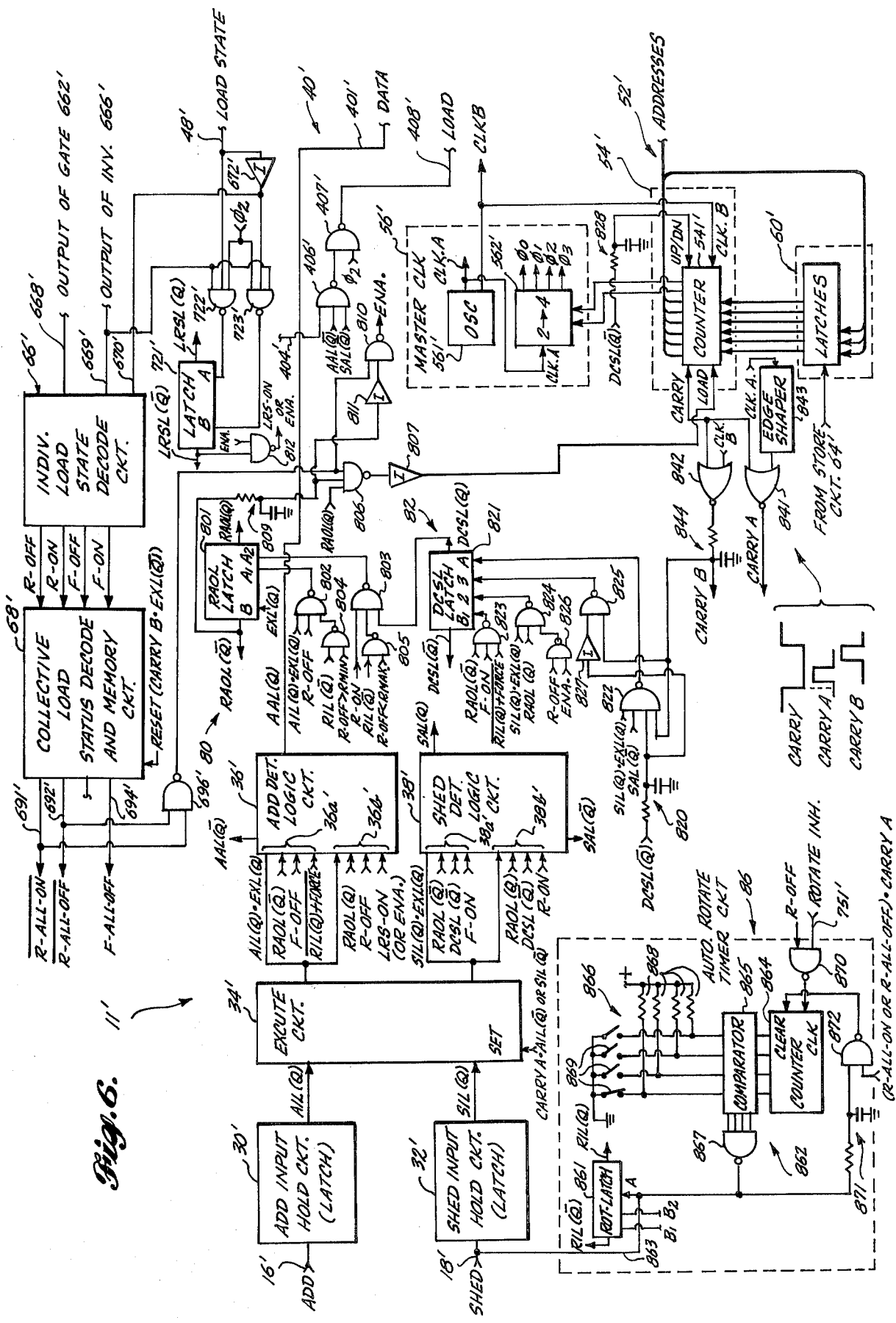

DIGITAL LOAD CONTROL CIRCUIT AND METHOD FOR POWER MONITORING AND LIMITING SYSTEM

BACKGROUND OF THE INVENTION

In general, the present invention relates to electrical control systems in which the power consumed by a plurality of loads connected to a power source is monitored and compared with a reference input. The reference input is selected to effect a predetermined constant power rate or a variable rate that over a given interval yields a desired total power usage. If the comparison with the reference input indicates an overload condition (excessive power rate) then one or more of the loads are automatically disconnected (shed). If an underload condition (inefficiently low power rate) is indicated, one or more loads are automatically connected to the source (added). The add and shed load corrections adjust the actual rate of consumption so that it falls within an acceptable range centered about the reference rate.

Systems incorporating the principles of the present invention, as more fully described herein, can be adapted for use in a wide variety of applications. However the invention is primarily intended for use in a power monitoring and limiting system of the type commonly employed by customers of electrical utilities for enabling the customer to obtain the most favorable billing rate offered by the utility. There are a number of variations of such systems, differing in the manner in which reference input is selected and in some cases varied to yield a desired power usage, and some of the more common types are rate systems, ideal curve systems and forecasting systems.

The benefits derived from power monitoring and limiting systems are best understood by reference to the operation of the utility company. The efficiency of the company depends to a large extent on the uniformity and consistency at which power flows from the central station, through the distribution networks, to the numerous utility users. In order to achieve and maintain a high level of efficiency, utilities have adopted certain practices designed to encourage customers to even-out their power consumption and in particular to avoid temporary, extraordinary peak loads that are incapable of being efficiently met by the utility's available power resources.

One practice in this respect is to bill the customer according to a formula that includes both the total energy consumed by the customer over a billing period, such as one month, and the highest or maximum rate of power consumed during any one of a continuous succession of relatively short time intervals, known as demand intervals. Typically, each demand interval is either 15, 30 or 60 minutes. Penalty charges are levied for overload conditions that use an abnormally high amount of power during any given demand interval. Thus it is to the benefit of the utility customer to even-out the rate of power consumption, by limiting the number of connected loads, as necessary, to prevent costly overload conditions.

For this purpose, power monitoring and limiting systems have been devised for monitoring the rate of power consumption and automatically shedding loads as necessary to avoid or minimize overload conditions, and automatically adding loads when needed to bring the power rate up to a level at which the electrical facilities of the user are at optimum utilization.

The present invention concerns improvements in method and apparatus for automatically performing the adding and shedding of electrical loads in systems such as described above. In particular, it is an object of the present invention to provide digital load control circuitry of the type that is responsive to load add and shed command signals in which provision is made for efficiently and precisely controlling a relatively large number of loads and for flexibility in the selection of the order or orders in which the loads are to be added and shed. The latter capability is of advantage in tailoring the control system to each user's electrical installation and in meeting changing conditions or requirements of each installation.

Another object of the present invention is to provide such load control circuitry having the capability of controlling one group of loads out of the total in accordance with a fixed priority add-shed schedule and for controlling another group of such loads in a non-priority rotated add-shed sequence. In this regard, one embodiment of the present invention provides digital circuitry that enables one group of loads to be selected as a fixed priority load group, within which the loads are added in a fixed sequence and shed in the reverse of such sequence, and enables another group of loads to be selected as a rotate load group, in which the loads thereof are added and shed in a variable rotating order. The add/shed order of the rotate group per se, is rotated in a manner similar to that disclosed in U.S. Patent application Ser. No. 587,150 for METHOD AND APPARATUS FOR CONTROLLING ELECTRICAL LOADS, filed June 16, 1975, and now U.S. Pat. No. 4,031,406 and assigned to the assignee of the present application.

A still further object of the present invention is to provide method and apparatus of the above type in which each of a plurality of loads can be quickly and easily selected to be a member of the fixed priority group or of the rotate group by means such as selector switches, to thereby afford substantial flexibility both in the initial set-up and in any subsequent alteration required of the add-shed sequences.

A further object of the present invention is to provide method and apparatus of the above type having the capability of selecting minimum and/or maximum limits on the number of rotate group loads (out of a total number of rotate loads) that can be turned OFF in response to the automatically produced add and shed command signals. In particular, the maximum limit enables the system to shed a succession of loads in response to a series of shed commands until the preset maximum number of OFF loads is reached, whereupon further shedding of rotate loads is prevented, thereby insuring minimal but safe lighting, heating, etc. Similarly, the minimum limit restricts the number of loads that can be automatically turned ON by a series of add commands and serves as an energy saving feature.

Additionally, it is an object of the present invention to provide method and apparatus of the above type that has the capability, in a standard production unit, of accommodating a variable number of controlled loads, so that a user of such unit can either increase or decrease his load capacity as needed to meet changing conditions.

SUMMARY OF THE INVENTION

The principles of the invention are embodied in a digital load control circuit that responds to add and shed command signals and selectively executes such commands to provide a predetermined load switchng sequence. The circuit includes a plurality of individually addressable load control latches, each having a load-OFF state and a load-ON state and each being connected to control a separate one of the electrical loads. The latches are successively addressed by an address-signal generator. A data input which is common to all the plurality of latches, and to which each such latch responds when and only when it is addressed.

A multiplexer, synchronized to the address-signal generator, has a plurality of inputs separately connected to the plurality of latches and has a common output at which a signal is produced to indicate whether the addressed latch is in its load-OFF or load-ON state.

To turn one of the OFF loads ON, an add detection logic circuit operates to detect a concurrence of a first set of conditions comprising: the receipt of an add command signal at the input of the load control circuit and a signal at the output of the multiplexer indicating that the latch being addressed is in its load-OFF state. In response to detection of the first set of conditions, the add detection logic circuit produces a signal at the data input to the load control latches that causes the latch then being addressed (namely the above-mentioned latch that was found in a load-OFF state) to be switched to its load-ON state. Similarly, a shed detection logic circuit operates to detect a concurrence of a second set of conditions comprising: the receipt of a shed command signal and a signal at the output of the multiplexer indicating that the latch being addressed is in its load-ON state. In response to the detection of this second set of conditions, the shed logic circuit responsively produces a signal at the data input to the load control latches which switches the above-mentioned latch to its load-OFF state.

Preferably the foregoing circuitry includes an add input latch and a shed input latch for storing the receipt of transitory add and shed command signals, respectively, for subsequent utilization by the add and shed detection logic circuits. Additionally, to synchronize the operations of the add and shed detection logic circuits with the switching of the load control latches, an execute circuit is provided for properly timing the application of the stored add and shed commands (add and shed input latches) to the add and shed detection logic circuits, respectively.

In one herein-disclosed embodiment of the above-described circuitry the entire bank of loads is controlled according to a fixed priority schedule. For this purpose the loads are arranged to be added (turned ON) by the load control latches in the order that the latches are addressed by the address-signal generator when it advances in a forward addressing direction. Thus for example, the first load to be turned ON will be connected for control by the latch first addressed by the address-signal generator, and the last load to be turned ON will be controlled by the latch that is to be addressed last. For shedding the loads in the proper sequence, means are provided that responds to a shed command signal for causing the address-signal generator to produce the address signals in a reverse addressing direction. Thus, the first load to be turned OFF in response to a shed command signal is that having the address of the last load to be added.

In accordance with another embodiment of the present invention, the load control circuit includes logic circuitry for operating the loads in a rotate mode. In such a mode, as generally described in the above-mentioned U.S. application, Ser. No. 587,150, the loads are added and shed in a non-priority basis. For example, in the embodiments disclosed the rotate loads are switched according to the rules: (1) that the load ON the longest is shed first (FIRST ON-FIRST OFF) and (2) that the load OFF the longest is added first (FIRST OFF-FIRST ON). To inplement these rules, the above-defined circuitry further includes a circuit means for responding to the output of the multiplexer for determining whether the last addressed latch (for a rotate load) is in its load-OFF or load-ON state. Such circuit means is connected to the add and shed detection logic circuits, such that the first set of conditions detected by the add detection logic circuit requires the additional condition that the last addressed latch be in the load-ON state. Satisfaction of this modified first set of conditions causes the add detection logic circuit to turn ON the first OFF rotate load encountered by the address-signal generator at the next higher address location succeeding a rotate load that is ON. The result is the addition of rotate loads in accordance with the above-mentioned rule (2) that the load that has been OFF the longest will be turned ON first. Similarly, the shed detection logic circuit responds to a modified second set of conditions, including the additional condition that the last addressed latch (for a rotate load) be in its load-OFF state before the above-defined remaining conditions of the second set are effective to shed a load. The result is that the first ON rotate load found in the next higher address position relative to an OFF rotate load, will be switched OFF by the shed detection logic circuit. Thus, the circuitry operates in accordance with the above rule (1) to shed the rotate load that has been ON the longest.

A further feature of the embodiment having a rotate mode is the use of an address memory circuit for memorizing the address of the last rotate load that has been either added or shed. The memory of such last acted upon rotate load is used for controlling the address-signal generator in a manner that enables the add detection logic circuit to select (for adding) the rotate load that has been OFF the longest, pursuant to an all-rotate-load-OFF status, and that enables the shed detection logic circuit to select (for shedding) the rotate load that has been ON the longest, pursuant to an all-rotate-load-ON status.

In accordance with another embodiment of the present invention, selection circuit means is provided for selectively enabling some of the plurality of controlled loads to be operated according to a rotate mode, as briefly summarized above, and others to be operated as fixed priority loads. Both the rotate and fixed priority groups are operated in succession in response to the add and shed command signals, and circuit means are provided for establishing the relative inter-group priority between the rotate and fixed priority groups. Additionally, decoding circuit means responsive to the selection circuit means and to the address-signal generator determines whether each load as it is addressed is a rotate load or a fixed priority load. To determine whether one of the rotate loads or fixed priority loads is to be added or shed in order to satisfy an add or shed command signal, circuit means is provided for determining whether the load control circuit is operating in a rotate mode or in a fixed priority mode. If in a rotate mode, the first rotate load that satisfies the above-mentioned sets of conditions, will be added or shed as required. Similarly, when in the fixed priority mode, the circuitry will operate to add or shed, as required, the proper fixed priority load.

A preferred form of the embodiment of the invention having rotate mode capability incorporates an auto-rotate timer circuit means for automatically, periodically effecting a rotation of the ON/OFF states of the rotate loads, independently of the receipt of add or shed command signals. For this purpose, simulated add and shed command signals are produced, in a manner similar to, but an improvement over, the automatic rotate circuitry disclosed in the above-mentioned U.S. application, Ser. No. 587,150. In the improved auto-rotate timer circuit, means are provided for counting the number of rotate loads that are OFF and automatically generating the simulated add and shed command signals, in close succession, when the accumulated number of OFF rotate loads reaches a predetermined count. Preferably, this count is adjustable so that the frequency (F) of the automatic rotation varies as a function of the number ($n$) of rotate loads OFF, e.g., if one rotate load OFF provides a frequency $F_1$ of automatic rotation, then $n$ loads OFF provide a frequency $F = nF_1$.

In accordance with still another embodiment of the present invention, useful for rotate loads, means are provided for adjustably setting a minimum limit on the number of rotate loads, out of the total available rotate loads, that can remain OFF. Similarly, means are also provided for adjustably setting the maximum number of rotate loads that can remain ON. Within the boundaries established by the minimum and maximum limits, the rotate loads can be added and shed in response to the add and shed command signals as summarized above. If in response to a succession of add command signals, the number of rotate loads that are OFF is decreased to or below the set minimum, then the circuit means operates to block further execution of add command signals. Similarly, when the maximum limit is reached or exceeded, the circuit means operates to block the execution of further shed command signals.

Further objects, features and advantages of the invention will become apparent from the following detailed description of particular and preferred embodiments thereof.

BRIEF DESCRIPTION OF THE DRAWINGS

FIG. 4 is a signal timing diagram depicting the timing relationships between certain, salient digital signals occurring in the digital load control circuit of FIGS. 3A–B.

FIG. 5 is another signal timing diagram similar to FIG. 4.

FIG. 6 is a block and schematic diagram of an alternative embodiment of the digital load control circuit of FIGS. 2 and 3A–B.

DETAILED DESCRIPTION OF THE PREFERRED EMBODIMENTS

Figure 1:
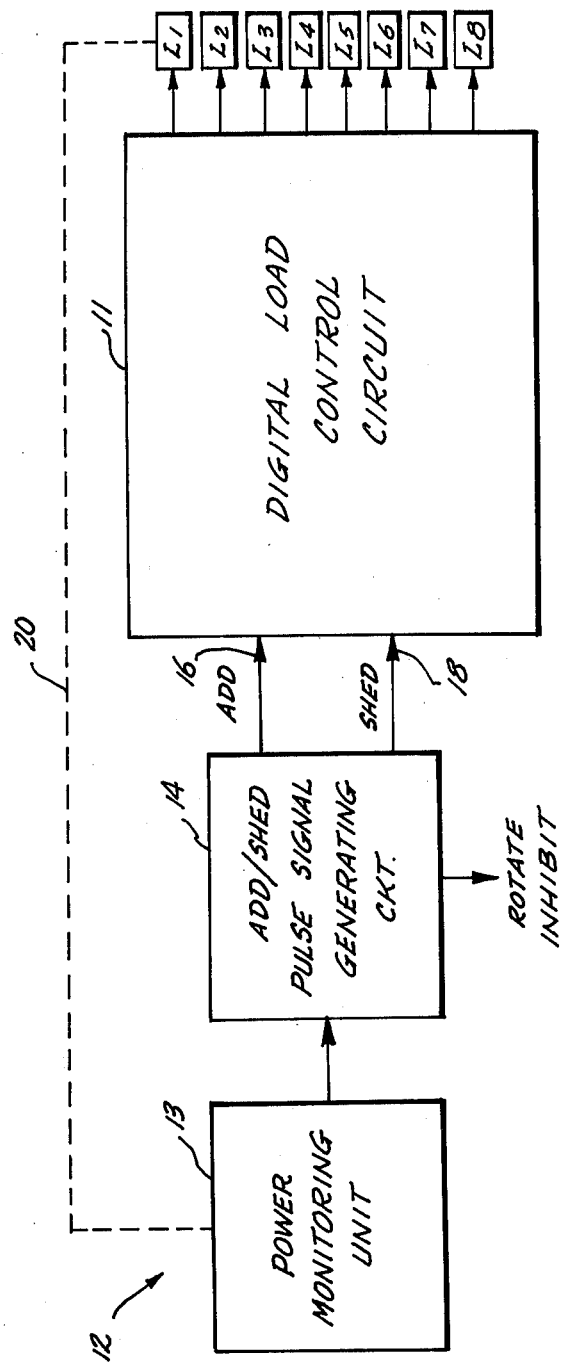
FIG. 1 is a generalized block diagram of a closed loop power monitoring and limiting system incorporating as one of the blocks thereof, a digital load control circuit for controlling the ON/OFF states of a plurality of electrical loads in response to add and shed command pulses.

With reference to FIG. 1, the present invention is directed to improvements in the digital load control circuit 11 that forms a component of a closed-loop power monitoring and limiting system 12 of the type in which the power consumed by a plurality of controlled loads, L1–L8, is monitored and compared with a reference input. If the monitored power, measured in this instance by power monitoring unit 13, deviates from the reference input (which may be constant or variable), then such occurrence is sensed and an add/shed signal generating circuit 14 responsively produces one or more add command pulses which are applied to an input 16 of circuit 11, or one or more shed command pulses which are applied to an input 18 of circuit 11. Each add pulse instructs circuit 11 to add (turn ON) one of the loads L1–L8 that has been in the OFF state, while each shed pulse instructs circuit 11 to shed (turn OFF) one of the previously ON loads.

As a particular example, circuits 13 and 14 may be of the type disclosed in copending U.S. Patent application, Ser. No. 707,566, for POWER MONITORING AND REGULATING CIRCUIT AND METHOD HAVING AN ANALOG INPUT REPRESENTING POWER RATE AND A DIGITAL OUTPUT FOR CONTROLLING THE "ON/OFF" STATES OF A PLURALITY OF LOADS filed concurrently herewith on July 22, 1976 by Warren L. Leyde and U.S. Pat. No. 4,034,22 expressly incorporated by reference herein. In such case, when the monitored power falls below a first predetermined power level circuit 14 produces one or more add command pulses to increase the power consumption rate by turning ON more loads and when the monitored power falls below a second predetermined level circuit 14 produces one or more shed pulses to decrease the power rate. The second predetermined power level is selected to be higher than the first level to establish a dead band between which the power consumption rate can fluctuate without causing add or shed pulses to be produced at the output of circuit 14. The center of the deadband is adjusted to lie at the desired average power rate, and system 12 operates to maintain the power rate within the deadband and thus close to the desired rate.

If the monitored power rate rises so as to just slightly exceed the second predetermined power level, then circuit 14 produces a single shed pulse and the consequent shedding of a single load by circuit 11 will be enough to bring system 12 back to a state of equilibrium with the monitored power lying within the deadband. If on the other hand, the monitored power climbs substantially above the second predetermined level, then two or more shed pulses will be produced, the number being proportional to the amount of deviation of the monitored power above the second predetermined level, and the consequent shedding of two or more loads will bring the system back into equilibrium.

SIMPLIFIED BLOCK DIAGRAM OF DIGITAL LOAD CONTROL CIRCUIT 11 (FIG. 2)

Figure 2:
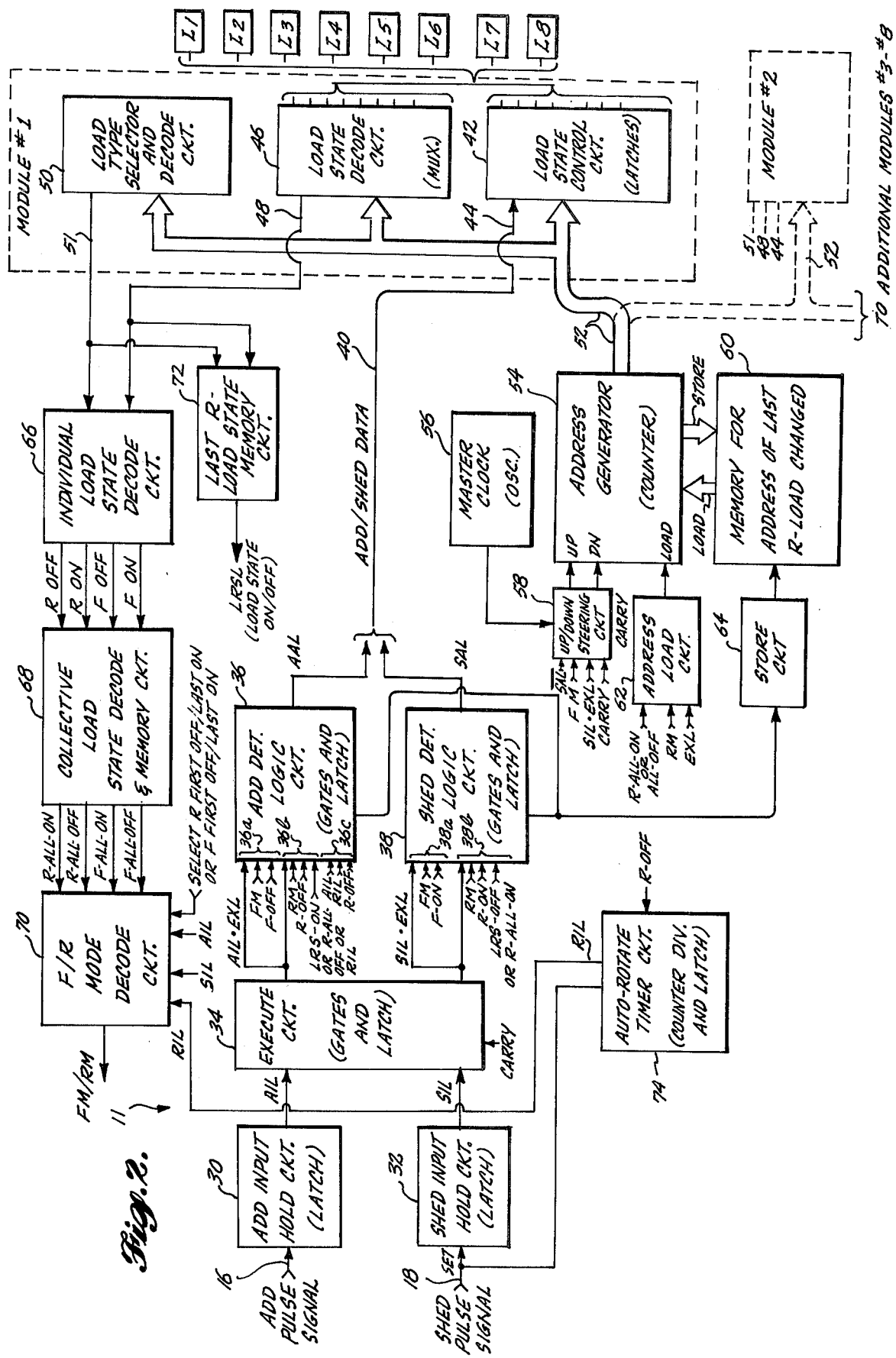
FIG. 2 is a block diagram of the organization and principal components of the digital load control circuit shown in FIG. 1, providing among other things for selectively dividing the total number of controlled loads into a fixed priority load group and a rotate load group.

Although in FIG. 1 circuit 11 is shown controlling eight loads L1-L8, the preferred embodiment of circuit 11 as shown in FIG. 2, includes a plurality of load control modules #1-#8, each accommodating a set of eight loads L1-L8 so that in total, circuit 11 can control up to 64 loads in response to the add and shed pulses received at inputs 16 and 18, respectively. As described more fully herein this control is accomplished by circuitry that enables each load in each module to be individually addressed for the dual purposes of determining the present state of the addressed load and for changing its present state to a new state as required by the add and shed command pulses.

Also, this particular embodiment of load control circuit 11 includes circuitry that enables each load to be selected as a fixed priority load or a rotate load in accordance with the above-described principles of the present invention. Thus, if all 64 load control outputs are to be used, this total number can be divided into two groups: a fixed priority group and a rotate group, with the individual loads of each group being controlled in accordance with the add/shed rules applicable thereto. Moreover, the operation of the two groups is integrated so that both groups are responsive, in a predetermined inter-group order, to the same add and shed command receiving inputs 16 and 18, respectively.

To simplify the block and schematic diagram of circuit 11, and to facilitate the accompanying description, certain components, functions and signals forming part of or being associated with the circuitry have been assigned abbreviations, each abbreviation having been derived from a word or phrase that is indicative of the component, function or signal. A list of these abbreviations has been compiled and is set forth below for the convenience of the reader.

List of Abbreviations

F—fixed priority load
R—rotate load
AIL—add input latch
SIL—shed input latch
EXL—execute latch
AAL—add action latch
SAL—shed action latch
FFO—fixed priority group first on
RFO—rotate group first on
FM—fixed priority mode
RM—rotate mode
LRSL—last rotate load state latch
LRS—last rotate load state
CARRY—a pulse from address generator occurring at the end of an addressing cycle
TE CARRY—a pulse that is coincident with the trailing edge of CARRY pulse As shown in FIG. 2, the add and shed command pulse signals received at inputs 16 and 18, respectively, are applied to circuitry including an add input hold circuit 30 and a shed input hold circuit 32 which temporarily store the add and shed commands, respectively.

Execution of the add and shed commands is accomplished by circuitry including an execute circuit 34, an add detection logic circuit 36 and a shed detection logic circuit 38. Circuits 34, 36 and 38 are responsive to add and shed commands stored in circuits 30 and 32 to produce, at the proper time, add or shed data signals that are fed over a signal path indicated at 40 to change the state of one or more load control latches within the various modules #1-#8.

Each module includes identical circuitry, and thus a description of module #1 will suffice for modules #2-#8. As shown, module #1 includes a load state control circuit 42 that in turn includes a plurality of bi-stable latches, a separate latch being provided for each of the eight loads L1-L8 controlled by the module. The latches of circuit 42, on command, switch each load to the proper ON/OFF state and hold it in such state until a change command is received. The change command occurs in the form of add or shed data signals fed over signal path 40 and applied to an input 44 of circuit 42 that is common to all of its latches.

Module #1 also includes a load state decode circuit 46, provided in this embodiment by a multiplexer having a plurality of inputs, one for each load L1-L8 and having a common output 48 at which a signal is produced indicating the ON/OFF states of the various loads.

Finally module #1 further includes a load type selector and decode circuit 50 that in conjunction with other circuitry, enables each of loads L1-L8 to be selected as either an F-load or an R-load or a permanently OFF state for the load (the latter being selected for example if the corresponding output of circuit 42 is unused). Each of circuits 42, 46 and 50 are addressable in parallel by an address signal bus 52, which also extends in parallel to the corresponding circuits of each of the remaining modules #2-#8. The address signals flowing in bus 52 successively and individually enable each separate latch in circuit 42 for receiving an add or shed data signal at input 44. Synchronously therewith, the address signals are applied to circuit 46 for producing at output 48 a signal representing the present state of the then addressed latch in circuit 42, and to circuit 50 for producing at an output 51 a signal representing the type of load, whether an F- or R-load that has been selected at that address.

The circuitry for generating the succession of address signals includes an address-signal generator 54 (basically a counter having a multi-bit binary output), a master clock 56 for producing a train of clocking pulses, and an up/down steering circuit 58 connected to the up and down clock inputs of generator 54 for controlling the direction of the addressing sequence. A memory 60 and a store circuit 64 are operatively connected to generator 54 for memorizing the address of the last rotate load that has been changed in state, and an address loading circuit 62 is connected to generator 54 for causing the contents of memory 60 to be dumped into the counter of generator 54. The latter operation occurs under certain conditions (described herein) and causes an interruption in the normal addressing sequence of generator 54, and directs the generator to commence at the address of the load next to the last R-load that has been changed.

To develop the necessary logic input signals for enabling circuit 36 and 38 to properly time the add/shed data signals (signal path 40), circuitry is provided for detecting the individual and collective load states as the load control latches of circuit 42 are successively addressed. Such circuitry includes an individual load state decode circuit 66 for receiving the succession of signals from outputs 48 and 51 of circuits 46 and 50, respectively, and for developing signals, at separate outputs, indicating the conditions of: R-OFF; R-ON; F-OFF; and F-ON (where R-OFF denotes an R-load in the OFF state, R-ON denotes an R-load in the ON state, etc.).

These individual load-state-indicating signals are in turn fed to a collective load state decode and memory circuit 68 that monitors the signals from circuit 66 for an entire address cycle, that encompasses all 64 load addresses, and determines the conditions of: R-ALL-ON; R-ALL-OFF; F-ALL-ON; and F-ALL-OFF (where R-ALL-ON denotes that all the R-loads are in the ON state, R-ALL-OFF denotes that all the R-loads are in the OFF state, etc.). Each such condition is represented by a signal at a separate output from circuit 68, and such signals remain constant, by reason of the memory feature of circuit 68, until a change in the represented condition occurs.

Additionally in this particular embodiment, an F/R mode decode circuit 70 is provided for decoding the combinations of the sets of conditions developed by circuit 68 and determining whether the circuit is operating in the rotate mode (RM) or fixed priority mode (FM). As described more fully herein, this feature enables the various loads of modules #1–#8 to be selected as F-loads or R-loads independently of their relative positions within the address cycle. Circuit 70 may be programmed to provide a desired inter-group priority in which either the F-group or the R-group can have the highest priority, i.e., selected to be the last group of loads to be shed in response to a series of shed commands and the first group to be added in response to add commands.

A circuit called the last R-load state (LRS) memory circuit 72 develops an LRSL ON/OFF signal which is applied as one of the inputs to add and shed detection logic circuits 36 an 38 and plays a principal role, as described more fully herein, in locating the proper R-load to be added or shed to satisfy the above-stated add/shed rules for the rotate group.

An auto-rotate timer circuit 74 receives signals representing the R-OFF state of individual R-loads as developed by circuit 66. The R-OFF signals are counted and when a predetermined number of such signals have been received by circuit 74, it automatically produces simulated add and shed command signals that cause an automatic rotation of the ON/OFF states of the R-loads independently of add and shed pulses applied at inputs 16 and 18. The frequency of such automatic rotation is thus, as indicated above, a direct function of the number of R-OFF loads.

In general, the operation of circuit 11 centers about add and shed detection logic circuits 36 and 38 which search for the proper load for satisfying an add or shed command by detecting certain sets of signal conditions at the inputs to these circuits. When a set of signal conditions is detected, the add or shed detection logic circuit applies a data signal to the then addressed latch of circuit 42 for changing the state thereof. A complete description of all of the input signal conditions to which circuits 36 and 38 respond will follow in conjunction with the description of FIGS. 3A–B. But for the present, it is observed that circuit 36 must receive and respond to a set of signal conditions including at least a signal representing the add command (held by circuit 30) and a signal representing a load-OFF state (namely R-OFF or F-OFF decoded by circuit 66). Circuit 38 on the other hand must receive and respond to a set of conditions including a signal representing the shed command (held by circuit 32) together with a signal representing a load-ON state (namely R-ON or F-ON decoded by circuit 66).

To locate a load-control latch in circuit 42 (or in one of its counterparts in modules #2–#8) that results in one of the above-mentioned sets of conditions being satisfied, address generator 54 is rapidly clocked through its address cycle by master clock 56 so as to individually address all of the available latches in modules #1–#8 within a brief time span. In doing so the signal conditions at the inputs to add and shed detection logic circuits 36 and 38 change depending on the selected type and state of that load controlled by each latch and on other conditions described hereinafter. When the addressing of the latches by generator 56 reaches a latch that satisfies a predetermined set of conditions at the inputs of circuits 36 and 38 then that latch is switched, either from its load-OFF state to its load-ON state by circuit 36, or from its load-ON state to its load-OFF by circuit 38.

Figure 3A:
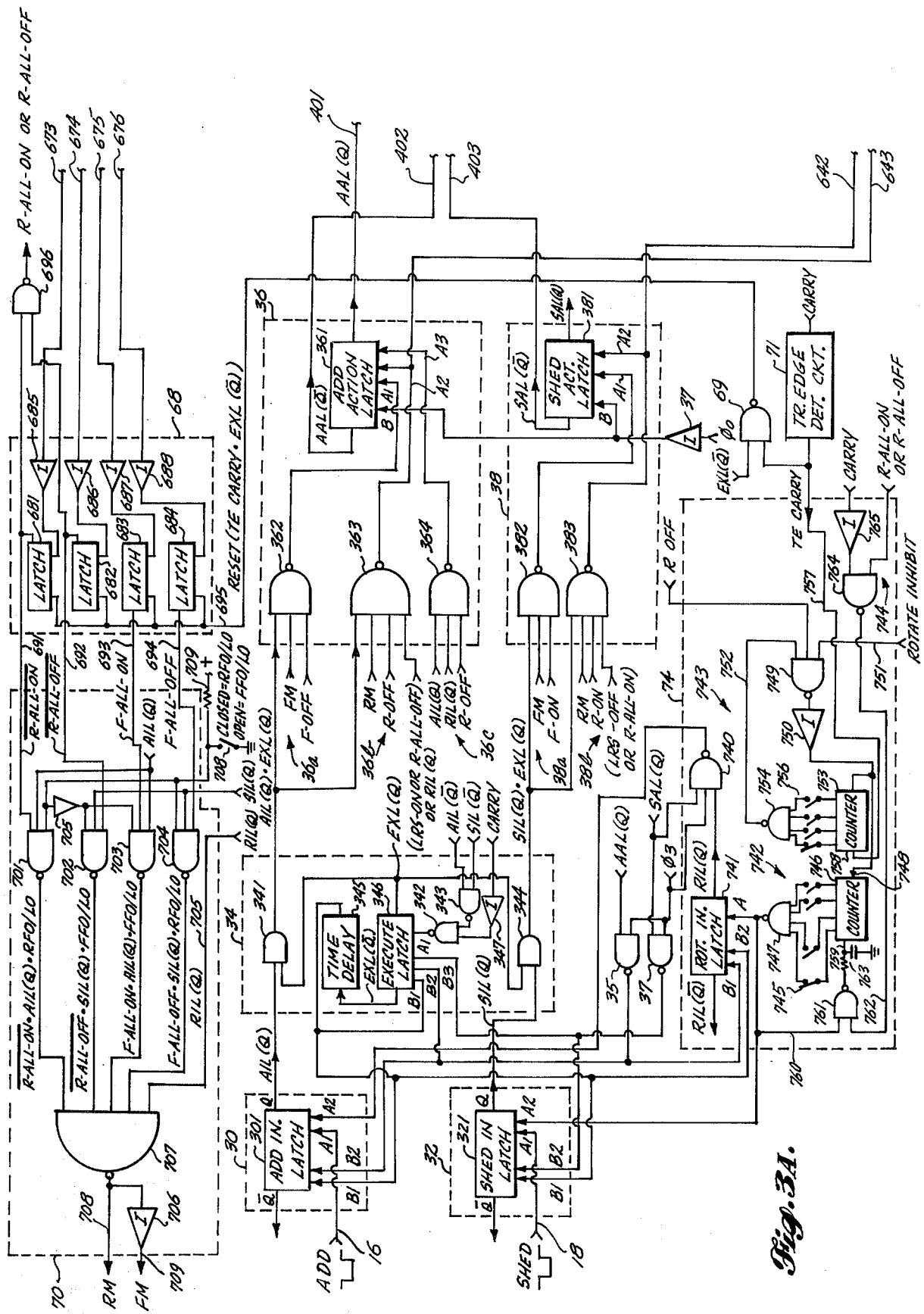
FIGS. 3A and 3B together make-up a detailed block and schematic diagram of the digital load control circuit shown more generally in FIG. 2.
Figure 3B:
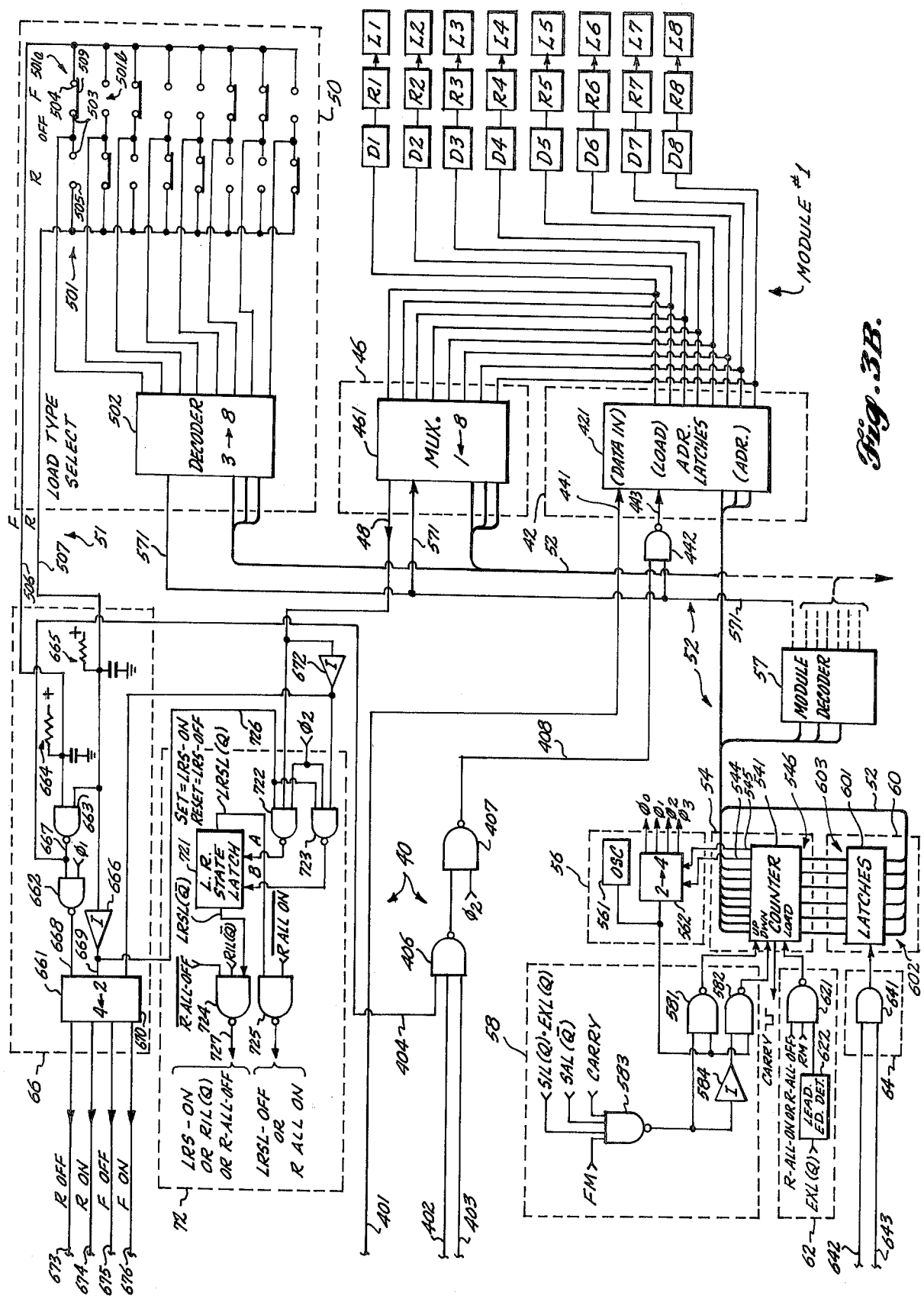

Description of Detailed Schematic and Block Diagram of Digital Load Control Circuit 11 (FIGS. 3A–3B)

Add and Shed Input Hold Circuits

With reference to FIG. 3A, add input hold circuit 30 is shown to include an add input latch (AIL) 301 which in this case and in all other cases as the term is used herein refers to a flip-flop having two stable states, a set state and a reset state. The outputs AIL(Q) and AIL($\overline{Q}$) of latch 301 are electrically complementary such that in the set state, AIL(Q) is high and AIL($\overline{Q}$) is low, whereas in the reset state, the opposite relationship exists. Latch 301 is set by a low-going input at either A1 or A2 and is reset by a low-going input applied to either input B1 or B2. In the case of latch 301 and for any latches described hereinafter, the inputs identified by A refer to the set inputs while those inputs identified with B refer to the reset inputs. Normally latch 301 is in the reset state and is responsive to an add pulse received at input 16 and applied to set input A1 to assume the set state causing the Q output to go high.

Shed input hold circuit 32 is composed of a shed input latch (SIL) 321 having inputs and outputs corresponding to the above-described latch 301. Latch 321 has its A1 input connected to input 18 for receiving a negative-going shed pulse to cause the latch to switch from it's normal reset state to it's set state, thereby causing the SIL(Q) output to go high and the SIL($\overline{Q}$) to go low.

Execute Circuit

Execute circuit 34 includes AND gates 341 and 344, NAND gates 342 and 343, time-out delay 345, execute latch (EXL) 346 and inverter 347. AND gate 341 has one input connected to AIL(Q) and another input connected to the EXL(Q) output of latch 346 in order to gate the add instruction represented by the set state of latch 301 to add detection logic circuit 36 only after latch 346 has been switched to its set state at the end of a given cycle of address generator 54. The latter function is effected by the A1 input of latch 346 being connected to an output of NAND gate 342 which in turn has one of its inputs connected to CARRY signal from address generator 54 via inverter 347 and its other input connected to an output of NAND gate 343. Gate 343 provides an OR logic function for gating the CARRY signal at gate 342 when either latch 301 or latch 321 is set causing their outputs AIL($\overline{Q}$) and SIL($\overline{Q}$), respectively, to go low. Latch 346 is reset by a signal applied to any one of reset inputs B1, B2 or B3. Reset input B1 is connected to an output of time-out delay 345 which has its input connected to EXL($\overline{Q}$) of latch 346 to provide a time-out for resetting latch 346 in the event of a malfunction of the circuit that prevents the latch from being reset in a normal manner by a signal one of inputs B2 or B3.

AND gate 344 functions in a manner similar to the above-described operation of AND gate 341, except that the former is connected to the SIL(Q) output of the shed latch 321 to gate the set state thereof to shed detection logic circuit 38 only after the execute latch 346 has been switched to its set state in response to the above-described input A1.

The outputs of gates 341 and 344 are respectively designated AIL(Q).EXL(Q) and SIL(Q).EXL(Q). The dot (.) convention represents an AND logic operator, e.g. AIL(Q).EXL(Q) will be high only if AIL(Q) is high and EXL(Q) is high.

Add Detection Logic Circuit

Add detection logic circuit 36 incorporates an add action latch (AAL) 361 having three set inputs A1, A2 and A3 connected to the outputs of NAND gates 362, 363 and 364 respectively. A reset input B is also provided for resetting latch 351, NAND gates 362, 363 and 364 each have a set of inputs responsive to a predetermined set of signal conditions so that latch 361 is switched to its set state only in the event the set of conditions at each gate is satisfied. Thus, gate 362 will set latch 361 when the set of conditions indicated at 36a is met, namely: AIL 301 being set and thus AIL(Q) being high and indicating the receipt of an add pulse at input 16, EXL 346 also being set and thus EXL(Q) being high, a high FM signal from circuit 70 indicating that the system is in a fixed priority mode, and a high F-OFF signal from circuit 66 indicating that a latch controlling a fixed priority load, in its load-OFF state has been addressed by generator 54. Similarly, gate 363 will set latch 361 at input A2 when the set of conditions indicated at 36b is met, namely: AIL and EXL both being set such that AIL(Q) and EXL(Q) are high, a high RM signal from circuit 70 indicating a rotate mode a high R-OFF signal from circuit 66 indicating that a latch controlling an R-load in the OFF state has been addressed by generator 54, and an alternative condition represented by LRSL-ON or R-ALL-OFF (the origin and function of which will be described herein). Finally, NAND gate 364 sets latch 361 at A3 when the set of conditions indicated at 36c is met, namely: AIL being set and thus AIL(Q) being high, RIL being set and thus RIL(Q) being high representing an automatic rotate mode (described herein) of circuit 74, and an R-OFF signal indicating that an R-load in the OFF state has been addressed.

Shed Detection Logic Circuit

Shed detection logic circuit 38 is similar to circuit 36 and includes a shed action latch (SAL) 381 having a set input A1 connected to an output of NAND gate 382 and having a set input A2 connected to an output of NAND gate 383. As in the case of gates 362, 363 and 364 of circuit 36, each of NAND gates 382 and 383 serves to respond to predetermined sets of signal conditions. Gate 382 sets SAL 381 when a set of conditions indicated at 38a is met, namely: SIL and EXL both being set and thus SIL(Q) and EXL(Q) being high a high FM signal from circuit 70 indicating that the system is in a fixed priority mode, and a high F-ON signal from circuit 66 indicating that a latch controlling an F-load in its ON state has been addressed by generator 54. Gate 383 sets SAL 381 when a set of conditions indicated at 36b is met, namely: SIL and EXL being set and thus SIL(Q) and EXL(Q) being high a high RM output signal from circuit 70 indicating a rotate mode, a high R-ON signal from circuit 66 indicating that a latch controlling an R-load in its ON state has been addressed, and an alternative signal condition indicated by LRSL-OFF or R-ALL-ON (the origin and purpose of which will be described hereinafter).

Latches 361 and 381 each have a reset input B that is connected to receive a reset signal occurring at a predetermined time within the address cycle of address-signal generator 54 as described herein for restoring the latches to their reset state following an add or shed action.

Add/Shed Data Path

With reference to both FIGS. 3A and 3B, the AAL(Q) output of latch 361 is connected over a line 401 of signal path 40 to a data input 441 of addressable latches 421 of load state control circuit 42. Additionally, the AAL($\overline{Q}$) output of latch 361 and the SAL($\overline{Q}$) output of latch 381 are connected over lines 402 and 403 respectively to a logic circuit in signal path 40 including NAND gate 406 and NAND gate 407, where the output of the latter is connected to one input of a still further NAND gate 442. Thhe output of gate 442 is connected to a load input 443 of addressable latches 421.

NAND gate 406 receives a third input from load state decode circuit 66 over a line 404 representing a condition in which the addressed load latch corresponding to one of loads L1–L8 has been selected to be permanently OFF by a bank of herein described programming switches in circuit 50. In response to its three inputs, gate 406 provides a logic OR function at its output for enabling NAND gate 407 to apply a data load signal to input 443 via gate 442 when any one of the following alternative conditions exists: latch 361 being in the set state and thus AAL($\overline{Q}$) being high, latch 381 being set and thus SAL($\overline{Q}$) being high, or line 404 being high indicating that the then addressed latch is to be switched to its load-OFF state.

Load State Control Circuit

Addressable latches 421 of circuit 42 of module #1 (FIG. 3B) respond in the following manner to the above-mentioned signal conditions in signal path 40. As each of latches 421 is addressed over bus 52, the addressed latch is enabled to respond to the conditions of the signals at inputs 441 and 443 for changing the state of such addressed latch. If the latch is to be disposed in a load-ON state then the signal at data input 441 is low. These signal conditions at data input 441 are effective at each set of address latches 421 only if the corresponding module has been addressed by a module decoder 57 in response to generator 54. If for example, the addressable latches 421 of module #1 are to be changed by the signals in signal path 40, then module decoder 57 in response to a module address on bus 52, produces a signal on line 571 that is connected to one input of gate 442 for enabling a load signal from an output of NAND gate 407 to pass to the load input 443 of latches 421. In the absence of a load signal at each latch address, the signal on data input 441 will not be effective to change the state of the addressed latch.

The set of eight outputs from latches 421 are separately connected to a set of relay drivers D1-D8 of module #1 which in turn drive a corresponding set of relays R1-R8. The loads themselves L1-L8 are turned ON and OFF indirectly by contacts of relays R1-R8 in a conventional and well-known manner.

Load State Decode CKT

Load state decode circuit 46 includes a multiplexer 461 that multiplexes the signals existing at its plurality of separate inputs into a common output 48 in response to and in synchronization with the succession of address signals received over bus 52. To provide such operation multiplexer 461 must be enabled, like latches 421, by module decoder 57 over line 571. The multiplexer inputs are connected individually to the set of 8 outputs from latches 421, and since the same address bus 52 is used for both multiplexer 461 and latches 421, the signal at common output 48 represents the state (load-ON or load-OFF) of the latch then being addressed at latches 421.

Load-Type Selector and Decode Circuit

Load type selector and decode circuit 50 includes a bank of manually operatable programming switches 501 and a binary to decimal decoder 502 that is addressed over bus 52 in synchronization with the addressing of latches 421 and multiplexer 461. Decoder 502 of module #1 is enabled over line 571 by module decoder 57. Each time one of latches 421 is addressed over bus 52, decoder 502 produces a logic high signal at the corresponding one of its plurality of eight outputs. Depending upon the position of the corresponding one of programming switches 501, this high-going signal as it appears successively at each of the decoder outputs is routed to circuit 66 either over line 506 (switch 501 in the F-ON position) or over line 507 (switch 501 in the R-ON position). A load-OFF switch position is also provided for each of switches 501, in which case the output from the decoder 502 is disconnected from both lines 506 and 507. As described more fully herein, this open condition is detected by NAND gate 406 to dispose the corresponding one of latches 421 in the load-OFF state. Thus it will be seen that a first switch 501A includes a pair of electrically common, inboard contacts 503 connected to the first output of decoder 502, an outboard contact 504 connected to the F-load indicating line 506, and another outboard contact 505 connected to the R-load indicating line 507. A conductive slider 509 has three positions: an F-ON position to the right, a load-OFF position in which slider 509 is centered, and an R-ON position to the left. As shown in FIG. 3B, switch 501a is associated with the first load L1 and has slider 509 in a position selecting load L1 as an F-load. The next switch 501b has its slider in a position selecting its associated load, namely load L2, as an R-load. Thus, with the switches disposed as shown in FIG. 3B, loads L1, L3, L6 and L7 have been selected as F-loads, while L2, L4, L5 and L8 have been selected as R-loads. An identical bank of switches is available in each of modules #2-#8 for making a load by load selection of the desired load type.

Master Clock

With further reference to FIG. 3B, clock 56 which provides clocking pulses for address generator 54, also provides in conjunction with generator 54 multi-phase timing signals $\phi_0$, $\phi_1$, $\phi_2$, and $\phi_3$ for synchronizing the various switching operations that occur throughout circuit 11. For this purpose clock 56 includes an oscillator 561 which may be provided by a well-known free-running astable multi-vibrator. The frequency of oscillator 561 is not critical, however by way of example a frequency of 2.18 KHz has been found satisfactory. The frequency of the oscillator should be sufficiently high so that the rate at which the latches 421, multiplexer 461 and decoder 502 and their counterparts in modules #1-#8 are addressed is sufficiently rapid to permit a change in the states of the various loads shortly after an add or shed command pulse has been received at inputs 16, 18 to circuit 11.

Steering Ckt. and Address Generator

The output of oscillator 561 is connected to a decoder 562 of clock 56 and to one input each of a pair of NAND gates 581 and 582 of up/down steering circuit 58. The outputs of gates 581 and 582 are fed to the up input and down input respectively of a binary counter 541 of generator 54 that responds to the pulse train output from oscillator 561 through either gate 581 to count up, or through gate 582 to count down (i.e., reverse count). A multi-bit address signal is thus generated which is connected to the plurality of outputs of counter 541 and hence over bus 52. The two least significant bit outputs 543 and 544 of counter 541 are connected to decoder 562 for producing four multi-phase timing signals $\phi_0$, $\phi_1$, $\phi_2$, and $\phi_3$. The higher order bit outputs of counter 541 form the module and latch addresses that appear on bus 52. Each time a new latch address appears on bus 52, decoder 562 is cycled to produce a full complement of four timing pulses $\phi_0$, $\phi_1$, $\phi_2$, and $\phi_3$.

In addition to NAND gates 581 and 582 up/down steering circuit 58 includes a four input NAND gate 583 that is responsive to the following signals: FM, SIL(Q̄).EXL(Q), SAL(Q̄) and CARRY. When gate 583 detects the concurrence all of the foregoing signals being high, its output switches from a normally high level to a low level gate 581 which disables (gate 581 normally steers the output pulse train from oscillator 561 to the up input of counter 541) and after inversion by inverter 584 enables gate 582 to pass the oscillator's output pulse train to the down count input of counter 541. Thus, the direction of address sequence developed by counter 541 is reversed.

Counter 541 produces a low-going CARRY pulse at the end of the address cycle following the highest order binary address produced on bus 52. In the foregoing operation of gate 583 of circuit 58, it will be noted that the gate 583 switches low at the end of the CARRY signal. In particular, SIL(Q̄).EXL(Q) will be switched high in response to the execute latch 346 being set by CARRY. Until the CARRY signal that is applied directly to one of the inputs of gate 583 ends and returns to the high logic level, the output of gate 583 cannot respond to the change in the SIL(Q̄).EXL(Q) signal. Therefore the counter advances to the end of the CARRY signal whereupon its counting direction is reversed (assuming gate 583 detects the above concurrence of input signal conditions) and the above-described reverse sequence of the address signal proceeds until the F-load that is to be shed is addressed as described more fully herein.

Address Loading Circuit

Address load circuit 62 includes a three-input NAND gate 621 that responds to the following conditions: R-ALL-ON or R-ALL-OFF as represented by a logic high developed by circuit 68 (FIG. 2); the RM signal at a logic high representing the rotate mode; and the leading edge of the high going EXL(Q) output of EXL 346 (FIG. 3A) as detected by leading edge detector 622. When these conditions are satisfied, an output of gate 621 pulses the load input of counter 541 to load into counter 541 the address previously stored by memory 60. Thus gate 621 is only operative when the system is in the rotate mode, all of the rotate loads are either all on or all off, and when EXL 346 of circuit 34 (FIG. 3A) is switched to the set state by an add or shed instruction held in circuits 30 or 32 (FIG. 3A) and a CARRY pulse at the end of the address cycle.

Last R-Load Change Memory and Store Circuit

Store circuit 64 includes a two-input NAND gate 641 having one input connected to receive an output of gate 383 of shed detection logic circuit 38 (FIG. 3A) over a line 642 and having its other input connected to receive the output of gate 363 of add detection logic circuit 36 over line 643. In combination with NAND gates 363 and 383, NAND gate 641 performs an OR logic function, in which the output thereof is switched high in response to either gate 363 or 383 detecting the sets of signal conditions indicated at 36b or circuit 36 and 38b of circuit 38, respectively, pursuant to which one of the R-loads is respectively added or shed. Storage latches 601 of memory 60 responds to the change in output state of AND gate 641 and stores the address of the module and latch corresponding to the particular one of the loads then being acted upon by either circuit 36 or 38. For this purpose, address bus 52 extends to the data inputs 602 of latches 601, while the data outputs 603 of latches 601 are connected to the dump inputs 546 of counter 541.

Load State Decode Circuit

Still referring to FIG. 3B, individual load state decode circuit 66 incorporates a decoder 661, NAND gates 662 and 663, a pull-up resistor and capacitive filter network 664 and another pull-up resistor and capacitive filter network 665, and an inverter 666. The F-load signals received over line 506 are connected to one input of NAND gate 663 via network 664 and the R-load signals on line 507 are connected to the other input of gate 663 and to inverter 666 via the other network 665. Both networks 664 and 665 serve to hold the respective inputs of gate 663 to which they are connected at a logic high level until a low-going signal is received on the respective one of lines 506 and 507. In response to either F-load or R-load indicating signals on lines 506 or 507, the output 667 of gate 663 switches high and thereby enables gate 662 to pass the $\phi_1$ timing pulse to a first input 668 of decoder 661. Concurrently therewith, inverter 666 applies the logic inverted R-load signal received from line 507 to a second input 669 of decoder 661. A low-going signal on line 506 (indicating that an F-load has been addressed) will thus produce a $\phi_1$ timing pulse at input 668 and a logic low at input 669 (because the R-load line 507 remains high in the absence of an R-load being addressed). Conversely, a low-going signal on line 507 indicating that an R-load has been addressed will again produce a $\phi_1$ timing pulse on input 668 but in this case the input at 669 will be at a logic high. Finally, a third input 670 of decoder 661 is connected via an inverter 672 to the common output 48 from multiplexer 461 of circuit 46 to indicate whether the addressed load in ON or OFF as represented by high and low logic levels at output 48, respectively.

The set of logic conditions at inputs 668, 669 and 670 of decoder 661 provide the information necessary for decoder 661 to produce signals on four separate output lines 673, 674, 675 and 676 reflecting the conditions of R-OFF, R-ON, F-OFF and F-ON, respectively. Each of these conditions will be represented by a high-going logic pulse coincident with the timing pulse $\phi_1$. Output lines 673, 674, 675 and 676 are connected to collective load state decode and memory circuit 68 (FIG. 3) and to various inputs of the condition detecting NAND gates 362, 363, 364, 382 and 383 of add and shed detection logic circuits 36 and 38 (FIG. 3A).

Collective Load State Decode And Memory Circuit

With reference to FIG. 3A, collective load state decode and memory circuit 68 is formed by a bank of latches 681, 682, 683 and 684 having their set inputs connected through inverters 685, 686, 687 and 688 to the output lines 676, 674, 675 and 676, respectively, from decoder 661.

During a complete address cycle, each of latches 681–684 operates to detect a collective condition of the F and R loads by being switched to and held in a set state if one or more high logic pulse signals appear on the associated one of lines 673–676. Thus, latch 686 detects an R-ALL-ON condition by determining whether any R-OFF pulses appear on line 673. If none appear during a complete address cycle, all the R-loads must be ON and this is reflected by latch 681 remaining in its reset state. In this embodiment, the output of latch 681 appearing on line 691 is high when the latch is set and low when the latch is reset. Thus the designation R-$\overline{\text{ALL-ON}}$ associated with line 691 represents the logic complement of R-ALL-ON such that when the signal on line 691 is low it indicates that all R-loads are ON and when such signal is high it indicates that all R-loads are not ON. Similarly latch 682 responds to R-ON pulses on line 674 to develop on line 692 a signal designated R-$\overline{\text{ALL-OFF}}$ (that is the logic complement of R-ALL-OFF). Latch 683 responds to F-OFF pulses on line 675 to develop an F-ALL-ON output on line 693, and latch 684 responds to F-ON pulses to produce an F-ALL-OFF signal on output line 694. The F-ALL-ON and F-ALL-OFF signals, when high, represent the existence of F-ALL-ON and F-ALL-OFF conditions, respectively.

Latches 681–684 are reset at the end of an addressing cycle by TE CARRY.EXL($\overline{Q}$), representing the trailing edge of CARRY and EXL being reset. The requirement that EXL be in its reset state prevents the destruction of collective load state information held in latches 681–684 while add and shed commands are being executed by circuits 34, 36 and 38. TE CARRY.EXL($\overline{Q}$) is produced on line 695 by an output of NAND gate 69 having one input connected to EXL($\overline{Q}$) and another input connected to an output of a trailing edge detection circuit 71.

A two input NAND gate 696 to which the R-$\overline{\text{ALL-ON}}$ and the R-$\overline{\text{ALL-OFF}}$ signals on lines 691 and 692, respectively, are applied, produces a signal at its output that when high represents the alternative logic conditions of R-ALL-ON or R-ALL-OFF. The output of gate 696 is applied to an input of the hereinabove described gate 621 of store circuit 62 (FIG. 3B) and to a hereinafter described input of rotate circuit 74 (FIG. 3A).

The collective load state indicating signals developed by circuit 68 are used by F/R mode decode circuit 70 to determine whether the system is presently in a fixed priority mode, i.e. operating on the F group of loads, or whether the system is in a rotate mode, i.e. operating on the R group of loads. Additionally, the R-ALL-ON and R-ALL-OFF signals are fed to other locations within circuit 11 to provide the necessary logic for performing certain functions, such as determining which R load is to be turned on first following an R all off condition, and which R load is to be turned off first following an R all on condition.

F/R Mode Detection Circuit

F/R mode detection circuit 70 includes a set of three input NAND gates 701, 702, 703 and 704, inverters 705 and 706 and a five input NAND gate 707. A programming switch 708 together with a logic bias source including resistor 709 provide means for programming circuit 70 so as to select an intergroup priority between the R group of loads and the F group of loads. As indicated by the legends adjacent switch 708, when such switch is closed, the rotate group is first on and last off (RFO/LO) and thus has the higher priority, and when open, as shown in FIG. 3A, the F group is first on and last off (FFO/LO) and thus has the higher priority. As an example of the latter condition, the F loads will all be turned ON first in response to a sequence of add pulses at input 16, before any of the R loads are turned ON. Conversely, if all loads are initially ON and a series of shed pulses are received at input 18, all the R loads will be turned OFF first before the shed commands begin operating on the F-loads.

Gate 701 of circuit 70 detects the concurrence of: R-loads not being ALL-ON, AIL 301 being set by an add pulse at input 16, and the F-load group being selected to be first on and last off (FFO/LO). For this purpose the three inputs of gate 701 are connected to line 691 to receive $\overline{\text{R ALL ON}}$, to AIL 301 to receive AIL(Q) and to switch 708 to receive FFO/LO.

Similarly gate 702 detects the concurrence of: all R-loads not being off; SIL 321 being set; and the R-load group being selected to be first on and last off (RFO/LO). For this purpose gate 702 has one of its inputs connected to switch 708 through inverter 705 to receive RFO/LO, another input connected to receive SIL(Q) and a third input connected to line 692 to receive R-ALL-OFF. Gate 703 has its inputs connected to detect the concurrence of high logic conditions of: F-ALL-ON appearing on line 693; AIL(Q); and RFO/LO. Gate 704 has its three inputs connected to detect the concurrence of high logic conditions of: F-ALL-OFF on line 694; SIL(Q); and FFO/LO. The outputs of gates 701-704, together with a signal designated RIL($\overline{\text{Q}}$) the function of which is to be described herein, are connected as separate inputs to a five input NAND gate 707 which decodes the combinations of conditions detected by gates 701-704 and produces at its output a signal indicating whether circuit 11 is in the rotate mode (RM) or fixed priority mode (FM). In practice the output of gate 707 is divided into two signal paths one of which is provided by line 708 connected directly to the gate output and representing (when high) a rotate mode, and a line 709 connected to the gate output through inverter 706 and representing (when high) a fixed priority mode.

To understand the operation of gate 707 it is best to think of the output therefrom being normally low, thus representing an FM condition by virtue of output line 709 being at a logic high level. To produce low level condition at the output, all of the inputs to gate 707 are necessarily at a logic high level. When however, any one of the inputs to gate 707 is switched low, then the output of gate 707 switches high thereby indicating an RM condition on output line 708. Any given one of the inputs to gate 707 will switch low when the various sets of signal conditions at the inputs to each of gates 701-704 are met, or when a logic low level signal is received from RIL($\overline{\text{Q}}$). Ignoring for the time being the RIL($\overline{\text{Q}}$) signal, NAND gate 707 thus in general functions to detect which of the groups (rotate or fixed priority) has the intergroup priority determined by switch 708, whether the load to be acted on next is to be added or shed, and whether the collective states of either the fixed priority or rotate group require, in relation to the two foregoing determinations, circuit 11 to assume the rotate mode on the one hand or the fixed priority mode on the other hand.

The RIL($\overline{\text{Q}}$) input to NAND gate 707 represents an operating condition in which rotate circuit 74 is in the process of generating the previously described simulated add and shed commands for execution by circuit 34 and by circuits 36 and 38 to automatically rotate the ON/OFF states of the rotate group and constitutes a special rotate mode operation. When RIL($\overline{\text{Q}}$) goes low on line 705, the output 708 of NAND gate 707 switches high to indicate RM.

Last R-Load State Memory Circuit

With reference to FIG. 3B, last rotate load state memory circuit 72 incorporates a last rotate state latch (LRSL) 721, a pair of NAND gates 722 and 723 the outputs of which are connected to the set and reset inputs, respectively, of latch 721, and a further pair of NAND gates 724 and 725 that have separate inputs connected to be responsive to the complementary output states LRSL(Q) and LRSL($\overline{\text{Q}}$) of latch 721.

One input each of NAND gate 722 and 723 is connected over line 726 to the output of inverter 666 of decode circuit 66 so as to enable these gates in response to each negative going, R-load indicating signal developed on line 507. A second input of each of gates 722 and 723 receives a signal from output 48 of multiplexer 461 of circuit 46 representing the ON/OFF state of the addressed rotate load wherein output 48 is connected directly to the aforementioned input of gate 722 and is connected indirectly to the aforementioned input of gate 723 through inverter 672. A third input of each gates 722 and 723 is connected to receive timing pulses $\phi_2$ from decoder 562 of clock 56, for synchronizing the switching functions of gates 722 and 723 in response to the R-load signals on line 726 and the ON/OFF signals at multiplexer output 48.

Latch 721 responds to the outputs of gates 722 and 723 by assuming a set state when the output of gate 722 is switched low in response to a concurrence of an R-load signal, a load-ON signal and $\phi_2$ at the inputs of such gate. Conversely, latch 721 assumes the reset state in response to the output of gate 723 when such gate detects the concurrence of an R-load signal, a load-OFF signal and $\phi_2$. As a result, latch 721 memorizes the ON/OFF state of the last R-load to be addressed.

NAND gate 724 has three inputs, one of which is connected to the LRSL($\overline{Q}$) output of latch 721, while the other two inputs are connected to the R-$\overline{\text{ALL-OFF}}$ signal developed at the output of circuit 66 and the RIL($\overline{Q}$) signal produced by auto-rotate timer circuit 74 (FIG. 3A). An output 727 of gate 724 is connected to one of the inputs of gate 363 of add detection logic circuit 36 (FIG. 3A) and performs a logic OR function by which the mentioned input of gate 363 is driven high when either the last rotate load is LRS-ON, or RIL is set, or all rotate loads are off (R-ALL-OFF). The existence of any of these signal conditions produces a logic high at the above-mentioned input of NAND gate 363 and arms NAND gate 363 to detect the concurrence of high logic conditions at its remaining inputs. Thus when an R-load is to be added and at least on R-load is OFF and auto-rotate timer circuit 74 is inactive, latch 721 of circuit 72 functions to block the setting of AAL 361 by gate 363 in response to an R-OFF load until the address generator 54 has scanned past one or more R-ON loads.

NAND gate 725 is conjunction with latch 721 provides a similar function during the shedding of an R-load. One input of gate 725 is connected to the LRSL(Q) output of latch 721 while the other input of gate 725 is connected to receive the R-$\overline{\text{ALL-ON}}$ from decode and memory circuit 68. The output of gate 725 is connected to one input of NAND gate 383 of shed detection logic circuit 38 to provide a logic OR function thereat in which the mentioned input of gate 383 is switched high when either latch 721 is reset (LRS-OFF), or an R-ALL-ON condition exists. The resulting operation is to block the switching of shed action latch 381 by gate 383 in response to an R-ON load until address generator 54 has scanned past one or more R-OFF loads.

Auto-Rotate Timer Circuit

With reference to FIG. 3A, circuit 74 includes a rotate input latch (RIL) 741 which assumes a set condition during an automatic rotate action, a counting circuit 742, a truncate circuit 743 and a clear circuit 744. Latch 741 is switched to the set state in response to a signal received at the A input thereof by an output of counting circuit 742 which functions to receive and count the number of R-OFF pulses produced by circuit 66 (FIG. 3B). When the number of such R-OFF pulses has reached a predetermined amount, an output of counting circuit 742 sets RIL 741. This predetermined amount can be selectively set by manually operated programming switches 745 connected between the outputs of a binary counter 746 and the inputs of a four input NAND gate 747. The output of NAND gate 757 is connected to the A input of latch 741 for setting the latch as mentioned above, and to the A2 input of SIL 321 of circuit 32 for simultaneously switching SIL to the set condition. A NAND gate 740 has one input connected to RIL(Q), a second input connected to $\phi_3$ and a third input connected to SAL(Q) for producing at its output a latch setting signal that is applied to A2 of AIL 301.

Counter 746 has an input 748 connected to receive the R-OFF pulses through a NAND gate 749 and an inverter 750 connected between the output of gate 749 and input 748. Gate 749 serves to block the R-OFF pulses from reaching counter 746 under certain conditions. The first of these conditions is when a rotate inhibit signal is received over line 751 from circuit 14 (FIG. 1) that is produced concurrently with the generation of add and shed pulses by circuit 14 in response to power monitoring unit 13 and serves to temporarily disable the automatic rotate action of circuit 74 while circuit 11 responds to the add or shed commands. Line 751 is connected to one input of gate 749 to disable gate 749 during the above operation of circuit 14.

Secondly, gate 749 blocks the R-OFF pulses by means of another of its inputs being connected over line 752 to a gate disabling signal produced by truncate circuit 743 when the latter has accumulated a predetermined number of R-OFF pulses in a counter 753. In particular, truncate circuit 743 includes counter 753, a four input NAND gate 754 and a set of manually operable programming switches 756 connected between the outputs of counter 753 and the inputs of gate 754. With programming switches 756 disposed in a desired count-selecting position, counter 753 accumulates a predetermined number of R-OFF pulses and thereupon causes a switching change at the output of gate 754 that is applied over line 752 to the input of gate 749 for blocking (truncating) further R-OFF pulses from passing through the gate to the input 748 of counter 746.

Counter 753 is cleared at the end of each address cycle by a TE CARRY signal fed over line 757 to the clear input 758 of counter 753 so that at the beginning of each address cycle, counter 753 commences counting with an empty register. Switches 576 thus may be set so as to limit the number of R-OFF pulses accumulated by counter 764 during each address cycle, regardless of how many R-loads are in the OFF state.

Counter 746 is cleared at a clear input 759 by either an output from gate 747 fed over line 760 to one input of NAND gate 761 or by an output of clear circuit 744 fed over 762 to the other input of gate 761. The output of gate 761 is applied to the clear input 759 via an RC delay network circuit 763. Clear circuit 744 includes a NAND gate 764, the output of which is connected over line 762 to gate 761, and an inverter 765. Inverter 765 connects the CARRY signal to one input of gate 764, while the other input of gate 764 is connected to the output of gate 696 and thus receives a logic high signal in response to either R-ALL-ON or R-ALL-OFF conditions.

RIL 741 is reset by either the output of gate 35 applied to the B1 reset input, or by the output of time-out delay 345 applied to the B2 reset input.

Operation of Circuit 11

To assist in understanding the overall operation of circuit 11, timing diagrams shown in FIGS. 4 and 5 have been prepared. FIG. 4 represents an FM operation and FIG. 5 represents an RM operation.

Fixed Priority Mode

With reference to FIG. 4, the loads L1–L8 have been disposed in certain initial conditions and are switched first by an add command pulse at input 16 and thereafter by a shed command pulse at input 18. The loads L1–L8 of module #1 have been selected as either R or F loads as indicated at the top of FIG. 4, and have been assigned a predetermined ON/OFF state as shown by the notations 1 = ON and 0 = OFF also as indicated at the top of FIG. 4. Only the module #1 loads L1–L8 are active, all the remaining loads associated with modules #2–#8 are unused and thus have been selected to be permanently off by the programming switches corresponding to switches 501 of module #1 (FIG. 3B). It is thus observed that all of the F-type loads except L7 are ON and all of the R-loads are OFF.

The uppermost signal wave form in FIG. 4 is that produced by the output of oscillator 561 of clock 56 and which is fed to the input of counter 541 of address generator 54. To show the timing relationship between the continuous train of pulses produced by oscillator 561 and the multiple phase timing pulses produced at the four outputs of decoder 562 of clock 56, the pulse waveform in FIG. 4 has been grouped into repetitive sets of four pulses, in which each set represents the sequence of the timing pulses $\phi_0$, $\phi_1$, $\phi_2$ and $\phi_3$ produced by decoder 562. For a given addressing cycle, a sufficient number of clock pulses will be produced to address the entire bank of 64 loads.

The CARRY signal produced by counter 541 of generator 54, is depicted in FIG. 4 as a low going pulse occurring at the end of the addressing cycle, i.e. after the last load in module #8 has been addressed. A CARRY pulse thus occurs after each complete addressing cycle.

In FIG. 4 the addressing signals for loads L1-L8 of module #1 are depicted as high going logic signals occurring in succession and having a time width that encompasses each set of four timing pulses corresponding to $\phi_0$-$\phi_3$. Thus, during the time that each load is being addressed by the binary output of counter 541, a complete set of timing pulses $\phi_0$—$\phi_3$ is produced. Three addressing cycles are shown in FIG. 4. The third addressing cycle is commenced in a reversed addressing sequence and at the address of load L7 the sequence reverts to the forward direction for the purpose explained more fully herein.

The remaining waveforms of FIG. 4 depict the add pulse signal applied to input 16, the state of AIL 301 of the Q output thereof, a shed pulse signal applied to input 18, the state of SIL 321 at the Q output thereof, the state of EXL 346 at the Q output thereof, the mode of circuit 11 (RM or FM) as determined by mode decode circuit 70, the state of AAL 361 at the Q output thereof and which is applied to the data input 441 of address latches 421 of load state control circuit 42, and the state of the load signal applied to load input 443 of latches 421.

The leading edge of a negative going add command pulse at input 16 switches AIL(Q) high thereby responding to and holding the add command for subsequent execution. It is observed that the receipt of the add pulse occurs during the initial addressing cycle depicted in FIG. 4. As indicated by the legend adjacent the sequence of address signals for L1-L8, this initial addressing cycle occurs in the forward addressing direction and corresponds to the "up" counting direction of counter 541 of address generator 54 (FIG. 3B).

The add command stored by AIL is executed in the second addressing cycle (depicted in FIG. 4) as follows. At the leading edge of the negative going CARRY pulse that is produced by counter 541 of generator 54 at the end of each addressing cycle, EXL(Q) is switched high by means of a set signal applied to A1 of EXL via gates 342 and 343 and inverter 347. Since both AIL and EXL are in their set states, the logic signal represented by AIL(Q).EXL(Q) at the output of AND gate 341 is at a logic high thereby arming the first input of NAND gate 362 of add detection logic circuit 36. The second input of gate 362 is armed by the logic high FM signal existing at output line 709 from decode circuit 70 representing the fact that the circuit is in the fixed priority mode. The third and only remaining input of gate 362 is now able to respond to a high going F-OFF pulse from decode circuit 66, which will occur when the address signal produced by generator 54 addresses L7. L7 is arranged in the addressing sequence so as to be the lowest priority F-load and is thus the last F-load to be turned ON.

When generator 54 addresses L7 (or more precisely, addresses the one of latches 421 that controls L7), decode circuit 66 responds by producing an F-OFF signal at the third input of gate 362, whereupon the output of gate 362 switches AAL to its set state. AAL(Q) is thus switched high. As shown in FIG. 4, the switching of AAL(Q) occurs at timing pulse $\phi_1$ inasmuch as the output signals from decode circuit 66 are synchronized to $\phi_1$. The logic high signal at AAL(Q) is fed over line 401 of signal path 40 to data input 441 of latches 421 of circuit 42 (FIGS. 3A-3B), and concurrently therewith, gates 406 and 407 respond to AAL($\overline{Q}$) being switched low and to the timing pulse $\phi_2$ to apply a logic high pulse to the load input 443 of latches 421 through module enable gate 442. Thus at the timing pulse $\phi_2$, the latch associated with L7 is switched to a load-ON state as depicted in FIG. 4.

The various latches are restored to their reset states in the following manner. At the timing pulse $\phi_3$, AIL 301 is reset by the output of gate 35 applied to reset input B2 of AIL 301, and similarly EXL 346 is reset at its input B2 by the output of gate 35. AIL is now restored for receiving and holding a succeeding add command. AAL 361 is reset via inverter 37 at $\phi_0$ of the succeeding series of timing pulses.

During the second addressing cycle shown in FIG. 4, a shed command is received in the form of a shed pulse applied to input 18. The trailing edge of this shed pulse switches SIL 371 from its reset to its set state, causing SIL(Q) to go high. The shed command is thereby held in SIL for execution in the succeeding addressing cycle.

At the end of the second addressing cycle, during which the shed pulse was received, the CARRY pulse output from counter 541 switches EXL 346 to its set state, by means of gates 342, 343 and inverter 347. This is depicted in FIG. 4 as a change in the output level of EXL(Q) to the high state at the trailing edge of the CARRY pulse. With both SIL and EXL being in the set states, the output of AND gate 344 of execute circuit 34 is now at a logic high level reflecting the condition SIL(Q).EXL(Q). The first input of NAND gate 382 is thereby armed. Similarly the second input of gate 382 is armed by the high logic level output on line 709 from decode circuit 70 reflecting the existence of the fixed priority mode (FM). Gate 382 is now armed for responding to the first F-ON signal produced by decode circuit 66 for causing a load-shed action of SAL 381.

To shed the proper load in this instance, the addressing sequence of generator 54 is reversed so that the first active F-load addressed will be that of the lowest priority F-type load namely L7. It is observed that if the addressing cycle were to proceed in its normal, forward addressing sequence, the first ON F-load addressed would be that of L1 which is the highest priority F-type load and it is to be turned OFF last.

The reversal of the addressing cycle is effected by steering circuit 58 (FIG. 3b) in which gate 583 responds to the previously described input conditions thereat to disable gate 581 and enable gate 582 for applying the output pulse train from clock 56 to the down count input of counter 541. This occurs at the end of the addressing cycle in response to the CARRY pulse produced by counter 541.

As shown by the third addressing cycle depicted in FIG. 4, the sequence of addressing is commenced in the reverse direction with modules #8–2 being addressed first and in that order. The first address signal for module #1 produced by counter 541 of generator 54 is that corresponding to L8.

Accordingly, the first ON F-load of module #1 addressed by generator 54 is L7. At timing pulse $\phi_1$, an F-ON signal is produced by decoder 66, thereby satisfying the conditions required at the inputs of gate 382, and causing SAL 381 to be switched to the set state. Responsively, SAL($\overline{Q}$) switches to a low logic level which causes gate 406 to arm gate 407. At the same time gate 583 responds to the switching SAL($\overline{Q}$) low and causes counter 541 to revert to the up or forward addressing direction. At the first $\phi_2$ timing pulse occurring in the forward addressing direction gate 407 to loads input 443 of latches 421 via module enable gate 442. The state of AIL 301 remains reset, and thus the data input 441 of latches 421 is at a low logic level directing the then addressed latch to be switched to a load OFF state. L7 is thereby turned OFF and the addressing continues with L8 of module #1 and through modules #2–#8 in the forward direction.

Following the shedding of L7, SIL 321 and EXL 346 are both reset by the output of reset gate 37 applied to B2 of SIL 321 and B3 and EXL 346. SAL 381 of circuit 38 is reset by the succeeding $\phi_0$ timing pulse applied to the reset input B of SAL through inverter 37. Although circuit 11 is intended to be used in most cases to provide a mix of F-loads and R-loads it will be appreciated that it can be set-up to operate in a fixed priority mode only with all of the active load being selected by circuit 50 as F-loads.

Rotate Mode

In FIG. 5, all of the F-loads are ON and the first arriving-command is an add command pulse. These conditions require circuit 11 to assume the rotate mode. (The rotate mode embraces two sub-modes: the change in load states in response to add/shed commands from circuit 14 (FIG. 1) and the change in load states in response to the auto-rotate action of circuit 74; the former sub-mode is described in this example.)

In the example depicted in FIG. 5, the last R-load to be shed is L2 and it is assumed that all of the loads in the remaining #2–8 have been previously turned off by the programming switches, corresponding to switches 501 for module #1. It is further assumed that the auto-rotate timer circuit 74 is in an inactive state and that switch 708 (FIG. 3A) is in the open position (FFO/LO) establishing the F-loads as the higher priority group.

Under these assumed operating conditions, circuit 11 now receives an add pulse at input 16. At the time the add pulse is received, an addressing cycle has already commenced and load L1 of module 1 is being addressed. Circuit 11 does not immediately turn on a load in response to the received add pulse but responds to and stores the ADD command in circuit 30 (FIG. 3A) by switching AIL 301 from the reset state to the set state. The only other change in the signal conditions occurring in response to the received add pulse during the current addressing cycle is a change in the output of mode decode circuit 70 in which output line 708 therefrom switches from a logic low level to a logic high level representing a change from the fixed priority mode (FM) to the rotate mode (RM). Although circuit 11, immediately prior to receipt of the ADD pulse, is in the fixed priority mode (FM) as indicated in FIG. 5, it is undetermined at that time, whether the new command will force the circuit into the rotate mode or whether it will cause the circuit to remain in the fixed priority mode. Since all of the R-loads are OFF, and all of the F-loads are ON, the circuit is in a borderline condition such that it will shift into the rotate mode if an add pulse is received (inasmuch as the only loads available for adding are now the R-loads), or it will be forced to remain in the fixed priority mode by the receipt of a shed pulse (inasmuch as the only loads now available for shedding are the F-loads).

At the end of the first addressing cycle depicted in FIG. 5, a CARRY pulse occurs which in conjunction with AIL($\overline{Q}$) being at a logic low causes NAND gate 343, inverter 347 and NAND gate 342 to switch execute latch 346 to the set state. In FIG. 5, EXL(Q) switches from a low logic level to a high logic level at the leading edge of the CARRY pulse and thus before the beginning of the second address cycle. The output of AND gate 341 is now at a logic high representing the condition AIL(Q).EXL(Q).

NAND gate 363 of add detection logic circuit 36 is now armed by AIL(Q).EXL(Q) applied to the first input, RM applied to the second input, and R-ALL-OFF applied to the fourth input. Only the receipt of an R-OFF signal at the third input of gate 363 is needed to cause circuit 36 to detect the concurrence of a proper set of conditions for adding one of the R-loads. If under these circumstances address generator 54 were allowed to proceed as usual from the beginning of the cycle through to the end of the address cycle, then it will be observed that the first OFF R-load reached by the address signals (namely L2) would produce an R-OFF signal at the third input of gate 363 and cause circuit 36 to turn that load ON. However, as earlier stated, under the operating conditions applicable in this example, wherein all of the R-loads are OFF, circuit 11 will function to add the R-load that has been OFF for the longest time, here being L4. To enable circuit 11 to turn ON L4 (rather than L2), address generator 54 in response to address loading circuit 62 skips to the $\phi_3$ phase of the L2 address previously memorized in memory 60 and from there advances in the forward addressing direction to L3, L4, etc. Since the address generator jumps to the $\phi_3$ phase of L2, even though L2 is in an R-OFF load it will not produce an R-OFF signal at gate 363 because the address generator has advanced beyond $\phi_1$ to which the R-OFF pulses are synchronized. The address skipping is accomplished by the above-described memory 60, address loading circuit 62 and store circuit 64 and the cooperation of these circuits with counter 541 of address generator 54.

The first R-load that satisfies the set of conditions at gate 363 is L4 and when it is addressed, an R-OFF signal is produced causing AAL 361 to be switched to the set state. This is shown to occur FIG. 5 at the time of $\phi_1$. The high logic level at the AAL(Q) output is applied to data input 441 and in response to the ensuing load signal produced by gates 406 and 407 in response to $\phi_2$ and applied to load input 443 of data latches 421 by gate 442, the addressed latch that controls L4 is switched to a load ON state.

The remaining portion of the address cycle is completed as usual with loads L4–L8 of module #1 being addressed by successive address signals fed over bus 52.

Following the execution of the add command, the various latches are reset in the following manner. AAL(Q) in its set state applies a logic high level signal to one input of NAND gate 35 to thereby arm gate 35 for passing time pulse $\phi_3$ to reset input B2 of add input latch 301 and to the reset input B2 of execute latch 346, switching both such latches back to their reset states enabling them to respond to subsequent inputs. Following the timing pulse $\phi_3$ that resets AIL and EXL, the next occurring timing pulse $\phi_0$ is applied through inverter 37 to the reset input B of AAL 361, resetting the latch.

Continuing with the example depicted in the diagram of FIG. 5, it is observed that during the second addressing cycle shown therein, a shed pulse is applied to input 18 commanding circuit 11 to shed a load. Shed input latch 321 responds to the shed pulse by switching to and remaining in the set state for the duration of the second addressing cycle to hold the shed command for subsequent execution. Execution occurs in the third addressing cycle shown in FIG. 5, and involves the following operations. With SIL(Q) high, execute latch 346 is switched to its set state at the leading edge of the CARRY pulse occurring at the end of the second address cycle. In turn, AND gate 344 of execute circuit 34 produces a high logic level signal at its output representing the condition SIL(Q).EXL(Q) which is applied to a first input of gate 383 of shed detection logic circuit 38. NAND 383 is now armed at the first input by the immediately above-mentioned output of AND gate 344 and at the second input by a high logic level RM signal since circuit 11 remains in the rotate mode. The remaining conditions needed for gate 383 to set SAL 381 are an R-ON signal from circuit 66 and an LRS-OFF signal from last rotate load state memory circuit 72 (the alternative condition of R-ALL-ON not being available since some of the R-loads remain OFF). The required set of the signal conditions R-ON and LRS-OFF implements the above-mentioned rule of operation pursuant to which circuit 11 sheds the R-load that has been ON the longest. By employing the LRS-OFF signal as one of the conditions of the set of conditions detected by gate 383, circuit 38 will not act to shed the first ON R-load addressed by generator 54 (in this instance L2) but instead will shed the first ON R-load following one or more OFF R-loads. (In this particular example, there is only one R-load ON and thus available for shedding, and consequently the load selecting function of LRS-OFF is not fully demonstrated here.) LRSL 721 is merely switched to the set state (LRS-OFF) as the address generator scans past L2, thereby providing the proper logic level at the output of gate 725 for arming the fourth input of gate 383 to detect the R-ON signal that occurs when the address generator reaches the address of L4.

The output of NAND gate 383 thereupon switches low, setting SAL 381 and causing SAL(Q) to go high. It is observed that the output of AAL (Q) remains low. The combination of SAL(Q) going high and AAL(Q) remaining low, effects the required switching at latches 421 of circuit 42. Gates 406 and 407 respond to SAL 381 being set to apply a positive going signal at input 443 of latches 421. The switching state of latches 421 is determined by the logic level at input 441 at the time of the high going signal is applied to input 443. To switch each latch to a load ON state, a high logic level is required at the data input 441, whereas to switch the addressed latch to a load OFF state a logic low level is required.

Since the latter condition exists in response to the operation of shed detection logic circuit 38, the low level at input 441 at the time a load pulse is applied to input 443 causes the then addressed latch to switch to the load OFF state (assuming it is not already OFF).

SAL 381 remains in the set state for a time sufficient to enable the resetting of SIL and EXL by means of gate 37 at the time of $\phi_3$. For this purpose, the output of gate 37 is applied to the reset input B2 of SIL 321 and the reset input B3 of EXL 346. SAL 381 is reset by the next succeeding $\phi_0$ timing pulse applied to its reset input B through inverter 37. Now the circuitry has been restored for responding to ensuing add or shed commands.

Auto-Rotate Mode

The forgoing operation of the rotate mode pertains to the response of circuit 11 to add and shed commands received from circuit 14 (FIG. 1) for increasing or decreasing the rate of power consumption. Another aspect of the rotate mode is the functioning of auto-rotate timer circuit 74 to automatically and periodically effect a rotation of the ON/OFF states of the R-loads independently of add and shed pulses applied to inputs 16 and 18 respectively.

For this purpose, counting circuit 742 of circuit 74 counts the number of R-OFF pulses produced by decode circuit 66 during one or more addressing cycles and when a predetermined total count is reached, RIL 741 is switched to the set state and simultaneously SIL 321 is switched to the set state, both by the output of gate 747 of circuit 742. The predetermined count at which circuit 742 produces the latch switching output at gate 747 can be selected by programming switches 745. By way of example, switches 745 in this embodiment provide an adjustable auto-rotate timing increment, for one R-load OFF of from 2 to 30 minutes. For more than one R-load OFF, the increment varies as a function of $T_0$ (the time increment for one R-load OFF) divided by N (equal to the number of R-loads that are OFF). The time interval can also be adjusted by switches 756 of truncate circuit 743 so as to provide an adjustable load limit (N) of N = 2 to 30.

When RIL 741 and SIL 321 are simultaneously switched to the set state by circuit 74, SIL(Q) goes to a logic high and initiates a response in execute circuit 34 and shed detection logic circuit 38 that effects a shedding of one of the R-loads substantially in the manner described above when SIL 321 responds to a shed command pulse at input 18. With RIL 741 in the set state, and SAL 381 being switched to the set state in response to SIL 321 and EXL 346 as described above, gate 740 is enabled to pass a timing pulse $\phi_3$ to the set input A2 of AIL 301. AIL 301 is now set and it initiates an operation of execute circuit 34 and add detection logic circuit 36 to effect the adding of one of the R-loads. To insure that circuits 36 and 38 act upon R-loads, RIL($\overline{Q}$) of RIL 341 is connected over line 705 as one input of gate 707 of mode decode circuit 70 so that the output line 708 from circuit 70 assumes a high logic level directing circuits 36 and 38 to act only in response to R-ON and R-OFF signals.

While generally the adding of a load in response to the switching of AIL 301 by the output of auto-rotate circuit 74 is similar to the previously described operation of circuit 11 in response to an add pulse applied at input 16, there are some differences. In particular, circuit 36 includes a separate three-input NAND gate 364 that has one input connected directly to AIL(Q), another input connected to RIL(Q) and a third input connected to receive the R-OFF pulses from circuit 66. Gate 364 thus responds directly to AIL 301 being in the set state and RIL 741 being in the set state to switch AAL 361 in response to the first arriving R-OFF pulse thereby bypassing execute circuit 34 which is reset immediately after SAL is set as SAL acts to shed a load as described above in response to RIL 741.

Similarly to the above-described set-up of circuit 11 for fixed priority mode only operation, circuit 11 can alternatively be set-up for rotate only operation by selecting all the active loads as R-loads at selector and decode circuit 50.

Alternate Embodiment of Digital Load Control Circuit (FIG. 6)

Digital load control circuit 11' as depicted in FIG. 6 is similar, both in construction and operation, to circuit 11 of FIGS. 2 and 3A-3B. For this reason, primed reference numerals are used to identify the elements in circuit 11' that correspond to like or similar elements employed in the previously described circuit 11.

The principal difference between circuit 11' and circuit 11 is the manner in which the various loads are selectively divided into the F and R groups. In circuit 11 as described above, any load at any address location can be selected as either an F- or R-load and circuit 11 will function to automatically treat the F- and R-loads as separate groups by virtue of the mode detecting capability of circuit 66. In circuit 11', the plurality of loads are selected so that loads of the same type are grouped together so as to have consecutive addresses rather than being intermingled. All of the R-loads are grouped together with no intervening F-loads. The F-loads may be divided into one or two homogeneous groups. If one F-group is selected, it can be disposed either before or after the R-group in terms of priority. If two F-groups are selected, one F-group will precede the R-group and the second F-group will follow the R-group. Thus the possible intergroup priority combinations are: FR, RF, and FRF.

The selection of the load types is performed by the programmable switches corresponding to switches 501 for module #1 as shown in FIG. 3B above and described above. If the loads of only module #1 are to be used in a particular application of circuit 11', and an FRF intergroup priority order is to be established, then the selection of loads L1-L8 might be as follows: L1, L2 selected as F-loads and forming the highest priority F-group; loads L3-L5 selected as R-loads and having an intermediate group priority; and L6-L8 selected as F-loads to constitute the lowest priority F-group. In response to a sequence of shed commands, the lowest priority F-group of L6-L8 will be shed in the order L8, L7 and L6; thereafter the rotate group L3-L5 will shed in accordance with the R-shed rule of the longest ON-first shed; and finally the highest priority F-group will be shed in the order L2 and L1. Conversely, when adding loads in response to a sequence of add commands, the highest priority F-group will be added first in the order L1, L2; then the rotate group L3-L5 will be added in accordance with the R-load add rule of the longest OFF-first added; and finally the lowest priority F-group will be added in the order L6, L7 and L8.

Circuit 11' thus offers the versatility of being able to select some of the F-loads as the lowest priority, and other F-loads as the highest priority, with the R-type group being available for operation as an intermediate priority group with the loads thereof controlled on a time-sharing, non-priority basis.

With reference to circuit 11' as shown in FIG. 6, most of the circuity is the same as described for circuit 11 above, and only so much of circuit 11 has been repeated in FIG. 6 as necessary to form a basis for disclosing the new or different circuitry associated with circuit 11'. Thus for the most part, the omissions in circuit 11' of FIG. 6 are merely to avoid repetition. However, one omission is substantive and that is the deletion of mode decode circuit 70 of circuit 11. In circuit 11' the determination of whether the circuitry is acting on an F- or the R-load is performed by a rotate action only circuitry 80 and a downcount shed circuitry 82, assisted by the initial homogeneous grouping of the F- and R-loads.

Circuit 11' also differs from the above-described embodiment in that the address generating circuitry including generator 54' and clock 56' has been modified and the up/down steering circuit associated with counter 541' had been replaced by the downcount shed circuit 82. Additionally, an auto-rotate timer circuit 86 has been altered from above-described circuit 74.

Rotate Action Only Circuitry

The rotate action only circuitry 80 includes rotate action only latch (RAOL) 801 having two set inputs A1 and A2 respectively connected to the outputs of a pair of three input NAND gates 802 and 803, and a reset input B connected to receive the EXL(Q) output from execute circuit 34'. Gate 802 has first and second inputs connected to receive the AIL(Q) EXL(Q) and the R-OFF signals respectively, and a third input connected to the output of a two input NAND gate 804 which in turn has its inputs connected to receive the RIL($\overline{Q}$) and a hereinafter described signal designated R-OFF>Rmin. Gate 803 has a first input connected to receive the R-ON signal, a second input connected to the output of a two input NAND gate 805 which in turn has its input connected to RIL($\overline{Q}$) and a hereinafter described signal designated R-OFF<Rmax. and a third input connected to an output from the downward shed circuitry 82.

Circuitry 80 further includes a three input NAND gate 806 the output of which is connected through an inverter 807 to the load control input of counter 541', and the three inputs of which are connected respectively to the RAOL(Q) output of latch 801, the RAOL($\overline{Q}$) output of latch 801 through an RC delay circuit 809, and to the output of gate 696' for responding to the alternative of R-ALL-ON or R-ALL-OFF. The connection of RAOL($\overline{Q}$) through delay circuit 809 to the second input of gate 806 provides a washout signal at the input to the gate that causes the output of gate 806 to momentarily switch to a logic high in response to latch 801 being switched from its reset to its set state, whereafter the output of gate 806 reverts to its normally low logic level as the RAOL($\overline{Q}$) output, delayed by circuit 809, is applied to the second input of gate 806. In addition to the foregoing logic circuitry, a two input NAND gate 810 is provided having a first input connected to receive the output of aforementioned gate 696' and a second input connected to receive the output of RAOL($\overline{Q}$) through integrating circuit 809 and through an inverter 811, where the output of gate 810 produces a logic signal called ENABLE (ENA.).

Down Count Shed Circuitry

Down count shed latch and associated circuitry 82 includes downcount shed latch (DCSL) 821 having a single set input A connected to the output of a four input NAND gate 822, and a set of three reset inputs B1, B2 and B3 respectively connected to the outputs of NAND gates 823, 824 and 825. Gate 823 has three inputs respectively connected to receive RAOL(Q), R-ON and RIL($\overline{Q}$). Gate 824 has three inputs respectively connected to receive SIL(Q).EXL(Q), RAOL(Q) and a signal produced at the output of NAND gate 826 which in turn has its two inputs connected to receive the R-OFF and ENA. signals. Finally, gate 825 has a first input connected to receive the DCSL($\overline{Q}$) output via RC delay network 820 and an inverter 827, and a second input connected to receive a CARRY signal (designated CARRY B) produced by a pulse shaping circuit responsive to the CARRY output of counter 541' as desired herein.

Gate 822 has four inputs a first of which receives SIL(Q).EXL(Q), a second of which receives SAL($\overline{Q}$), a third of which receives DCSL($\overline{Q}$) via an RC delay circuit 820, and a fourth of which receives a CARRY signal (identified as CARRY B) produced by a pulse shaping circuit associated with the CARRY output of counter 541' and which is described more fully below.

Clock and Address Generation

Master clock 56' includes an oscillator 561' having a pulse train output designated CLK.A, and a second pulse train output designated CLK.B that is 180° out of phase with respect to the CLK.A output. Decoder 562' produces the previously described multiphase timing pulses $\phi_0$–$\phi_3$ and is clocked by the CLK.A output. Addressed counter 541' of generator 54' is clocked by CLK.B. This establishes a predetermined phase relationship between $\phi_0$, $\phi_1$, $\phi_2$, $\phi_3$ and CLK.A and CLK.B.

The CARRY output from counter 541' is modified by a pulse shaping circuit 84 which includes first and second NOR gates 841 and 842, an edge shaper 843 and an RC delay circuit 844. Gate 841 has a first input connected to the CARRY output of counter 541' and has a second input connected to the CLK.A output of oscillator 561' via an edge shaper 543. Because of the interrelationships between oscillator 561', decoder 562' and counter 541', the CARRY pulse output from counter 541' encompasses in succession a positive going pulse from CLK.A and a positive going pulse from CLK.B. In view of this phase relationship, gate 841 is enabled by the low going CARRY pulse produced by counter 541' to pass the positive going pulse of CLK.A to the output of gate 841. The leading edge of the gated CLK.A pulse is delayed by edge shaper 843 so that CARRY A produced at the output of gate 841 is delayed slightly relative to the leading edge of the principal CARRY pulse. Gate 842 is similarly enabled by the low going CARRY pulse from counter 541' so as to pass the positive going CLK.B pulse from oscillator 561' during the second half of the CARRY pulse width. Circuit 844 delays the gated pulse output from gate 842 so that a slight time separation exists between the trailing edge of the CARRY A pulse from gate 841 and the leading edge of the CARRY B pulse produced at the output of circuit 844 as shown in the pulse timing sketch adjacent circuit 844 in FIG. 6.

Modified Auto-Rotate Timer Circuit

The modified auto-rotate timer circuit 86 includes a rotate input latch (RIL) 861 that corresponds to latch 741 in circuit 74 of the previously described embodiment of circuit 11 shown in FIG. 3A and thus has the complementary outputs of RIL(Q) and RIL($\overline{Q}$). As in the case of the above-described RIL 741, RIL 861 has a set input A that is responsive to the output of a pulse counting circuit 862 and has a pair of reset inputs B1 and B2 which, although not shown in FIG. 6, are connected to the same reset circuitry as B1 and B2 of RIL 741 of circuit 74 as shown in FIG. 3A. The output of pulse counting circuit 862 is also fed over line 863 to one of the set inputs of SIL 32' and if shown in detail would correspond to the connection of the output of pulse counting circuit 742 (FIG. 3a) of circuit 74 to the set input A2 of SIL 321 for initiating the automatic shed operation.

With further reference to FIG. 6, circuit 862 includes a binary counter having its output states connected to one side of a comparator 865. A programmable binary reference source 866 is connected to the other side of comparator 865, and a decoding NAND gate 867 is connected to comparator 865 to form the output of the pulse counting circuit 862. Source 866 includes a bank of load resistors 868 individually connecting the outputs of source 866 to a positive reference, and a bank of manually operable programming switches 869 for selectively connecting the various outputs of source 866 to ground and thereby establishing a predetermined binary reference at the outputs of source 866 connected to comparator 865. A two input NAND gate 870 passes R-OFF pulses received from circuit 66' to an input of counter 864 unless blocked by a rotate inhibit signal applied to one input of gate 870 from line 751' during operation of circuit 14. Counter 864 is cleared by a circuit connected to the output of gate 867 that includes an RC delay circuit 871, a two input NAND gate 872 one input of which is connected to the output of gate 867 through circuit 871, and the other of which is connected to receive the logic signal R-ALL-ON or R-ALL-OFF at CARRY A as produced by a logic circuit similar to clear circuit 744 that forms part of circuit 74 (FIG. 3A).

Operation of Digital Load Control Circuit 11' (FIG. 6)

Operation of rotate action only circuitry 80 and downcount shed circuitry 82 is best understood by reference to the shed and add sequences for an FRF grouping as per the above example. In particular, assume that only the loads L1–L8 of module #1 are operative. Furthermore, assume that in accordance with the previously described FRF example that L1 and L2 are F-loads having the highest priority, L3–L5 are R-loads having an intermediate priority, and loads L6–L8 are F-loads having the lowest priority.

Adding Highest Priority F-Loads

From a starting condition in which all eight loads L1–L8 of module #1 are OFF, circuit 11' responds to a succession of add pulses at input 16' as follows. The highest priority loads L1 and L2 are to be turned on first and this is accomplished by add detection logic circuit 36' acting during successive addressing cycles of address generator 54' to execute the add command each time the set of conditions at 36a' is satisfied. In the present instance, this will occur at the first address signal produced by generator 54' in the forward addressing direction, inasmuch as the latch controlling the state of L1 will be in the load OFF state and will thus cause a high logic level signal at the F-OFF input of circuit 36', which together with the other inputs comprising set 36a' will cause AAL of 36' to be set, thereby turning on L1. The other input signal conditions at 36a' include RAOL($\overline{Q}$) which is at logic high because RAOL remains reset and a function designated $\overline{RIL(Q)+FORCE}$ which is normally at a logic high and which has a purpose that is more fully described herein. After adding L1 the succeeding add pulse at input 16' will similarly cause L2 to be switched ON with the set of conditions 36a' being satisfied at the second address signal of the cycle as produced by generator 54'. Now, all of the loads in the highest priority F-group have been turned ON and circuit 11' will respond to any succeeding add pulses by turning on one or more of the R-loads.

Adding R-Loads

The adding of R-loads occurs as follows. With AIL and EXL being set, the signal AIL(Q).EXL(Q) is at a logic high, arming gate 802 of circuit 80 (along with the output of gate 804) for setting RAOL 801 in response to the presence of any R-OFF pulses. With generator 54' advancing in the forward addressing direction, the first R-load addressed will produce an R-OFF pulse thereby switching RAOL 801 to the set state and causing RAOL(Q) to go high and RAOL($\overline{Q}$) to go low. At this instance, gate 806 in response to RAOL(Q) and in response to the R-ALL-OFF condition detected by gate 691', causes counter 541' to be loaded with the contents of memory 60', that has previously memorized the address of the last R-type load shed. With a sight delay provided by circuit 809, gate 810 in response to the switching of RAOL 801 produces a logic low at the ENA. output thereof. The output of gate 810 is applied along with LRSL($\overline{Q}$) to the inputs of a two input NAND gate 812 to develop the logic function LRS-ON (or ENA.) which is applied to one of the inputs of circuit 36' that forms a set of conditions indicated at 36b'. In the present example LRS-ON is unavailable for satisfying the conditions at 36b' because the last rotate state is necessarily OFF in accordance with the R-ALL-OFF status and ENA. is needed to complete conditions 36b').

Under these conditions the first R-load that satisfies the set of conditions at 36b' will be the first R-OFF load addressed by generator 54', while advancing in the forward addressing direction from the address of the last rotate load to be shed. In the present example, it will be assumed that the last R-load to be shed is L5. Accordingly, the next R-load in the OFF state to be addressed by generator 54' is L3 and thus L3 will be switched ON first.

The addition of further R-loads will involve the operation of LRSL 721' in a manner similar to its functioning in circuit 11, as described above. In particular, succeeding add command pulses cause gate 802 to set RAOL 801 thereby satisfying all of the set of conditions indicated at 36b' of circuit 36' except R-OFF and LRS-ON. The concurrence of the latter two signal conditions causes circuit 36' to act to add the R-load that has been off the longest in accordance with the previously defined load adding rules for the rotate group. The set of conditions indicated at 36b' is thus repetitively detected during successive addressing cycles and L4, L5 are switched ON in that order.

Adding Lowest Priority F-Loads

Now all of the R-loads are ON and the only remaining OFF loads belong to the lowest priority F-group consisting of L6, L7 and L8. These loads are turned on in that order by the detection of the set of conditions 36a' at circuit 36' as generator 54' advances in the forward addressing direction. With all of the R-loads being ON, gate 802 will not set RAOL, and thus RAOL($\overline{Q}$) will remain high thereby satisfying all the conditions at 36a' except for F-OFF. As the addressing cycle reaches the address of L6, an F-OFF signal is produced to complete the set of conditions at 36a' whereupon circuit 36' acts to turn on L6. In succession, L7 and L8 are turned ON by repetition of the foregoing operation.

Shedding Lowest Priority F-Loads

Commencing from an initial condition in which all eight loads L1-L8 are ON, circuit 11' responds to a succession of shed pulses to turn off the complement of loads as follows. The first group of loads to be turned OFF is the lowest priority F-group consisting of L8, L7 and L6 which are to be shed in that order. The first shed pulse sets SIL of circuit 32' and the succeeding CARRY A pulse from circuit 84 sets EXL of circuit 34' establishing the condition SIL(Q).EXL(Q) at a high logic level. With SAL($\overline{Q}$) also being high and DCSL($\overline{Q}$) being high, gate 822 of circuit 82 responds to a CARRY B pulse from circuit 84 and sets DCSL 821. DCSL($\overline{Q}$) is applied to the up/down control of counter 541' through RC delay circuit 828, and when DCSL($\overline{Q}$) is switched low in response to DCSL 821 being set by gate 822, counter 541' is switched to the downcount mode, thereby reversing the addressing direction. Generator 54' thus commences with the highest order address, in this instance the address of L8 of module #8 (FIG. 2), and descends therefrom. Concurrently, gate 823, armed by RAOL($\overline{Q}$) and RIL($\overline{Q}$) looks for the first F-ON signal developed by circuit 66', which in the present example will be at the address of L8 of module #1. In response to the L8 F-ON signal, gate 823 resets DCSL 821. The switching of DCSL($\overline{Q}$) high causes counter 541' to revert to the forward addressing direction and sets SAL of circuit 38' by reason of the set of conditions at 38a' of shed detection logic circuit 38' being satisfied, namely: SIL(Q).EXL(Q) high, RAOL($\overline{Q}$) high, DCSL($\overline{Q}$) high, and F-ON high. Now with generator 54' in the forward direction and still addressing L8, and with SAL of circuit 38' in the set state, L8 is shed at $\phi_2$. Similarly in succeeding addressing cycles, shed commands cause a repetition of the foregoing sequence, resulting in each case with the shedding of one of the lowest priority F-type loads in the order L7 and L6.

Shedding of R-Loads

Further shed commands will now cause one or more of the R-loads to be turned OFF. In response to a shed command, gate 822 will set DCSL 821 in the same manner as described above, causing counter 541' to reverse to the down count mode. Since all of the lowest priority F-loads have been shed, gate 823 will not detect an F-ON signal during the downcount operation of counter 541', but instead the reverse addressing of generator 54' will reach an R-load that is ON causing gate 803 to set RAOL 801. In response thereto, gate 806 through inverter 807 loads counter 541' with the contents of memory 60' which has previously stored the address of the last R-load added. Also, gate 810 produces a low logic level (ENA.) representing the concurrence of RAOL being set and all the R-loads being ON.

Now the inputs to gate 824 are all at a logic high (the output of gate 826 being high by virtue of the above-mentioned ENA. signal), causing the output of gate 824 to go low to reset DCSL 821. Following the resetting of DCSL 821, the first three of the set of four conditions indicated at 38b' of circuit 38' are satisifed, and when address counter 54' advancing in the forward addressing direction reaches the next R-load in the ON state, an R-ON signal will be produced to complete the set of conditions indicated at 38b' and thereby cause circuit 38' to shed the then addressed load. In the present example, the last R-load added is L5 so that the first encountered R-ON signal will be that associated with L3 and circuit 38' will accordingly shed L3.

The next shed command pulse will produce a similar sequence of switching operations, except that DCSL 821 will be reset during the downcount of counter 541' at the first OFF R-load addressed thereby, which in the present example will be L3. After DCSL 821 is reset by gates 824 and 826, the counter will now revert to the forward addressing direction, looking for the first ON R-load, namely L4, which completes the set of conditions indicated at 38b' of circuit 38 and which causes such load to be shed. Since this last mentioned addressing scan commences from an R-load that is OFF, the conditions at 38b' will locate the R-load that has been ON the longest without requiring the LRS-OFF condition used in circuit 11 of FIGS. 2 and 3A-3B.

A gate 825 connected to the reset input B3 of DCSL 821 causes DCSL to be reset at CARRY B should gates 823 and 824 fail to reset DCSL in response to the given input conditions. This takes care of a special operating condition in which DCSL is in the down count mode, RAOL is set by gate 803 at an R-ON load and all the remaining R-loads in the down count direction are ON. DCSL 821 thus cannot be reset by gates 824 and 826 and it remains set and allows address generator 54' to address down to zero at which CARRY B is produced. Gate 825 responds to CARRY B and DCSL(Q) through inverter 827 and resets DCSL 821 causing address generator 54' to revert to the forward addressing direction. When the addressing in the forward direction reaches the first R-ON load all the conditions at 38b' are satisfied and that load is shed by the action of SAL.

Shedding of Highest Priority F-Loads

After all of the R-loads have been shed in this manner, succeeding shed command pulses will set DCSL 821 as above. But DCSL 821 will not be reset until gate 823 detects an ON F-load which will be L2. The set of conditions indicated at 38a' of circuit 38' is satisfied at the address of L2 and L2 is thereupon shed by the action of circuit 38'. Similarly a subsequent shed command will produce a repeat of the foregoing switching sequence of DCSL 821, causing the set of conditions at 38a' to again be met, thereby shedding the final F-load L1. During this mode of operation, RAOL 801 remains in the reset state.

Operation of Modified Auto-Rotate Timer Circuit

Auto-rotate timer circuit 86 counts the succession of R-OFF pulses from decode circuit 66' and when the count in counter 864 equals the reference established by source 86, gate 867 switches RIL 861 to its set state. Simultaneously, the output of gate 867 sets SIL over line 863. This initiates the automatic shed/add actions of circuits 38' and 36', respectively, similarly to that described above in connection with the operation of circuit 11 in response to auto-rotate timer circuit 74 of FIG. 3A except the add action is performed by AIL through EXL at the set of conditions 36b' rather than through a separate gate (see gate 364 of FIG. 3A) as in the case of circuit 11. RIL 861 is reset at reset input B1 after the simulated add command has been executed, or in the event of a malfunction in the execution of the add command, by a time-out signal applied to reset input B2 by a time delay corresponding to delay 345 described above in connection with execute circuit 34 in FIG. 3A.

Figure 7:
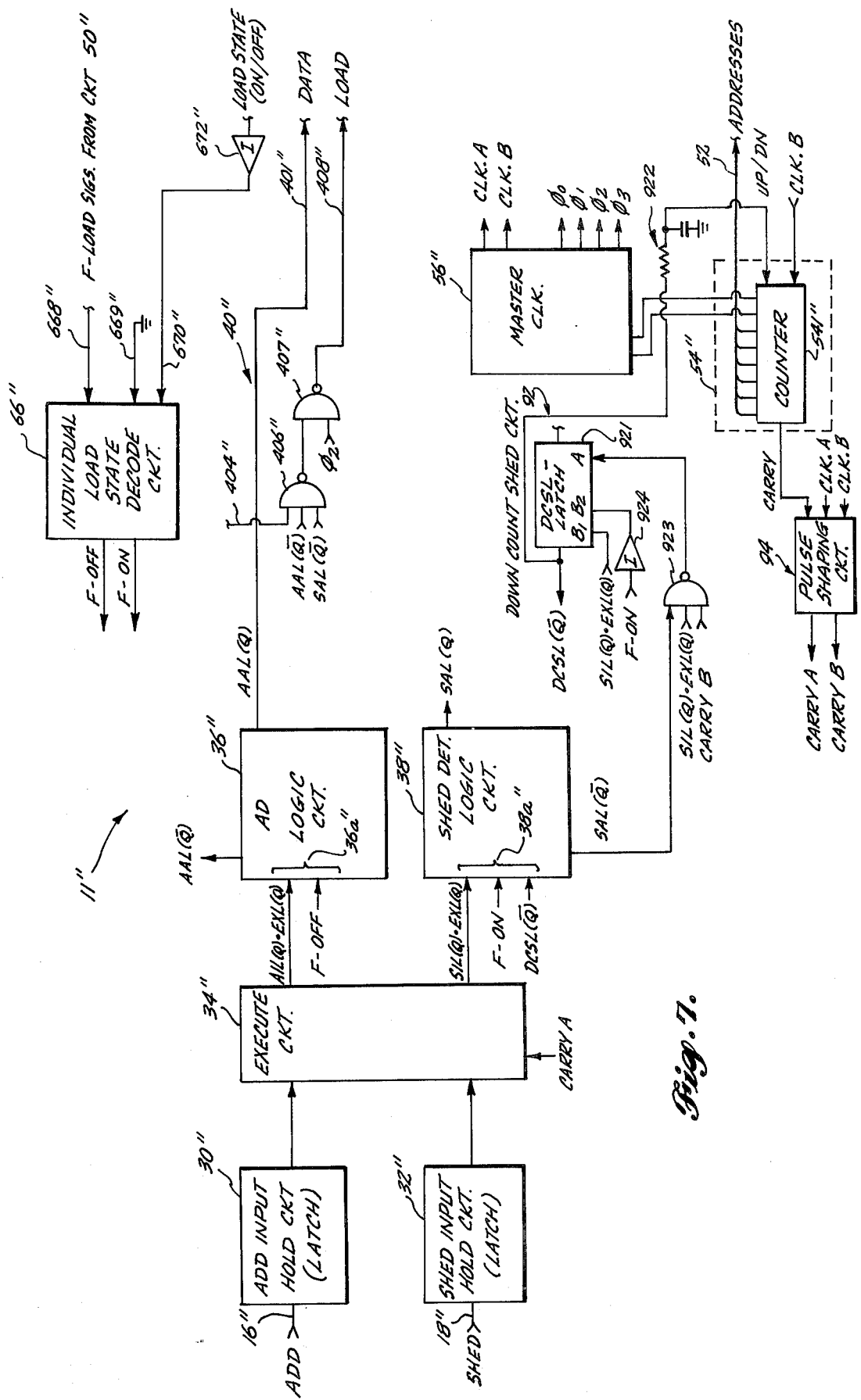
FIG. 7 is a block and schematic diagram of an alternative embodiment of the digital load control circuit and is limited to controlling a plurality of loads in a fixed priority order.

Description of Digital Load Control Circuit 11" (FIG. 7)

Digital load control circuit 11" as shown in FIG. 7 is an alternative embodiment of the invention, suitable for controlling F-loads only. There is no provision for selecting any of the controlled loads for operation in a rotate mode. Consequently, the logic for circuit 11" is simplified. Nevertheless, the principal circuit elements and overall organization are the same as the previously described embodiments, and thus circuit 11" includes add and shed input hold circuits 30" and 32", execute circuit 34", add and shed detection logic circuits 36" and 38", master clock 56", address generator 54" and individual load state decode circuit 66".

The load control modules for circuit 11", although not shown, each include a load state control circuit corresponding to circuit 42 in FIG. 2, and a load state decode circuit corresponding to circuit 46 in FIG. 2. The load type selector and decode circuit corresponding to circuit 50 is simplified to provide for only two positions of the programming switches (corresponding to switches 501 in FIG. 3B). Also as a consequence thereof, the inputs to circuit 66" are limited to the input on line 668", corresponding to line 668 of circuit 11 in FIG. 3B over which the F-load signals are received indicating whether the addressed load has been selected by the associated programming switch to be permanently OFF (i.e. unused) or whether it is available for responding to an add command. The input to circuit 66" on line 669 is grounded to permanently tie the R-load signal input to a logic low level.

The collective load state decode and memory circuit 68, F/R mode decode circuit 70 and the auto-rotate timer circuit 74 all forming part of the above-described circuit 11 are omitted in the F-load only control circuit 11".

A downcount shed circuit 92 serves to control the addressing direction of generator 54", thereby enabling the generator to add the loads in a first sequence and shed the same loads in the reverse of such sequence in accordance with a fixed priority schedule. Circuit 92 thus includes a DCSL 921 that functions in a manner similar to DCSL 821 of circuit 11'(FIG. 6) as described above in connection with FIG. 6 and includes a DCSL(Q) output that is connected through an RC delay circuit 922 to an up/dn. control on counter 541". DCSL 921 includes a set input A connected to the output of a three input NAND gate 923, and includes first and second reset inputs, B1 connected to receive SIL(Q).EXL(Q), and B2 connected to receive F-ON through an inverter 924. The DCSL(Q) output of DCSL 921 is not used in this embodiment.

The CARRY output from counter 541" is segregated into multiple phase CARRY signals designated CARRY A and CARRY B by circuit 94 which is identical to circuit 84 of circuit 11' described above in connection with FIG. 6.

Adding Loads

With all of the loads OFF circuit 11" responds to a series of add pulses at input 16" in the following manner. AIL of circuit 30" is initially set and in response to the succeeding CARRY A signal from circuit 94, EXL of circuit 34" is set. This establishes one of the conditions of the set at 36a" of circuit 36", since AIL(Q).EXL(Q) is high. The first F-OFF pulse produced by circuit 66" at circuit 36" will switch AAL to its set state and thereby switch the then addressed load ON. Since generator 54" is advancing in the forward addressing direction, the first OFF load encountered will be that of the highest priority load. Similarly the succeeding add commands cause each of the loads to be turned ON in successive addressing cycles, in their order to priority.

Shedding Loads

In response to a shed pulse received at input 18", SIL of circuit 32" is first set and thereafter at CARRY A, EXL of execute circuit 34" is set applying a logic high level signal to the SIL(Q).EXL(Q) input of shed detection logic circuit 38". Immediately thereafter, at CARRY B, gate 923 having been armed by the above-mentioned high logic level at SIL(Q).EXL(Q) and the high logic level of SAL($\overline{Q}$), sets DCSL 921 reversing the addressing direction of counter 541". Generator 54" thus commences at the address of the lowest priority F-load and descends therefrom until the first ON F-load is reached. At the address of such load, the following occurs. The F-ON signal applied to the reset input B2 through inverter 924 resets DCSL 921. At the same time the set of conditions 38a" detected at the input of circuit 38" are all at a logic high level, causing SAL to be switched to the set thereby, shedding the then addressed load at #$_2$ in the forward addressing direction of generator 54". The addressing cycle is thereupon completed in the forward addressing direction.

In response to succeeding shed pulses at input 18", the foregoing switching operations are repeated until all of the loads have been turned OFF in the order in which they have been connected to the latches of the load state control circuit (corresponding to circuit 42 of module #1 shown in FIG. 2). If DCSL 921 is not reset for any reason, then when SIL(Q).EXL(Q) reverts to the low logic level, DCSL 921 is reset at input B1. SIL(Q).EXL(Q) will be forced to the low logic level by the time-out operation of the delay corresponding to delay 345 in execute circuit 34 as shown in FIG. 3A and described above in connection with circuit 11.

Figure 8:
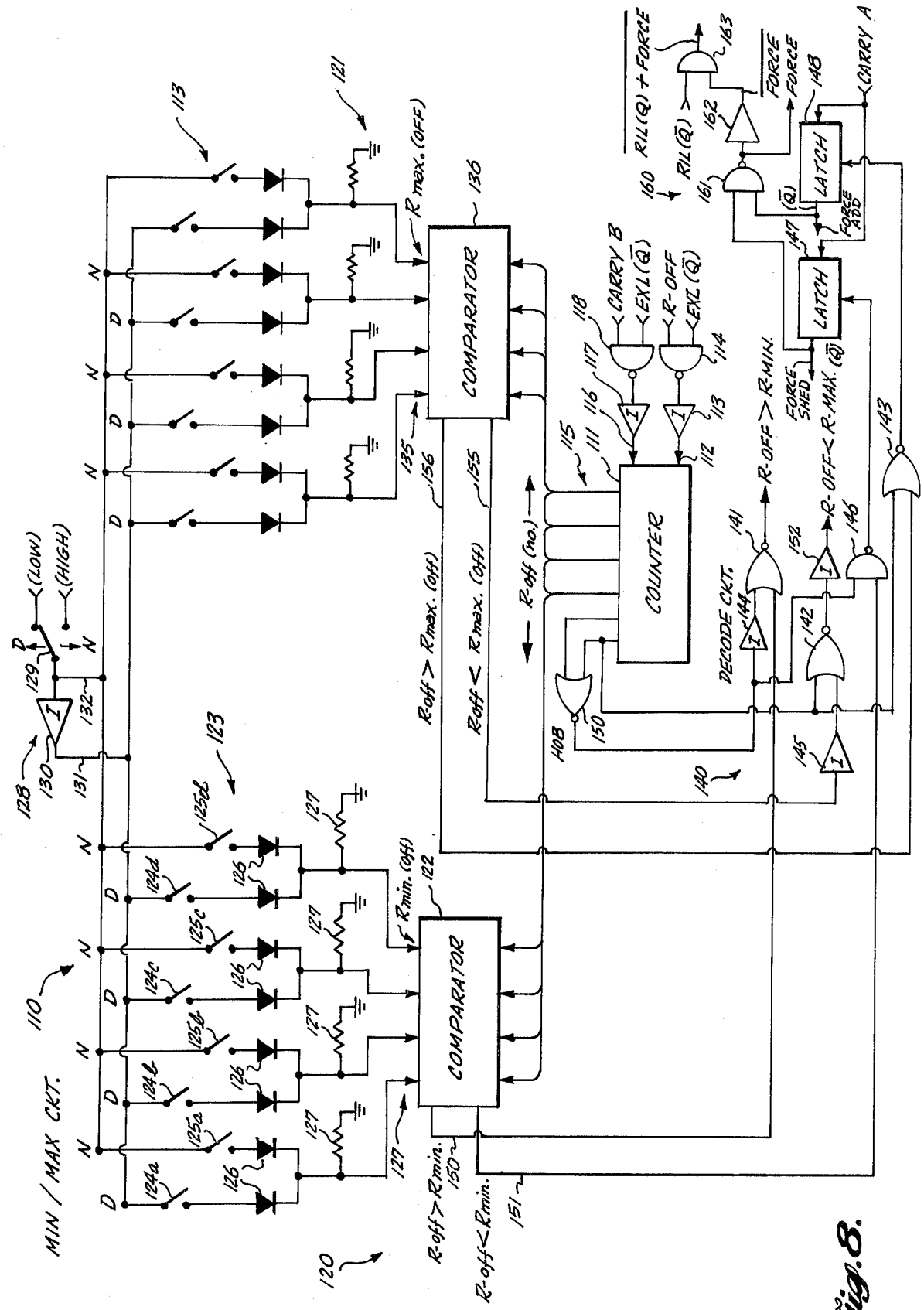
FIG. 8 is a block and schematic diagram of a further alternative embodiment of the invention that is used with the load control circuit of FIG. 5 and serves to set limits on the maximum number and minimum number of rotate loads that can be switched OFF.
Figure 9:
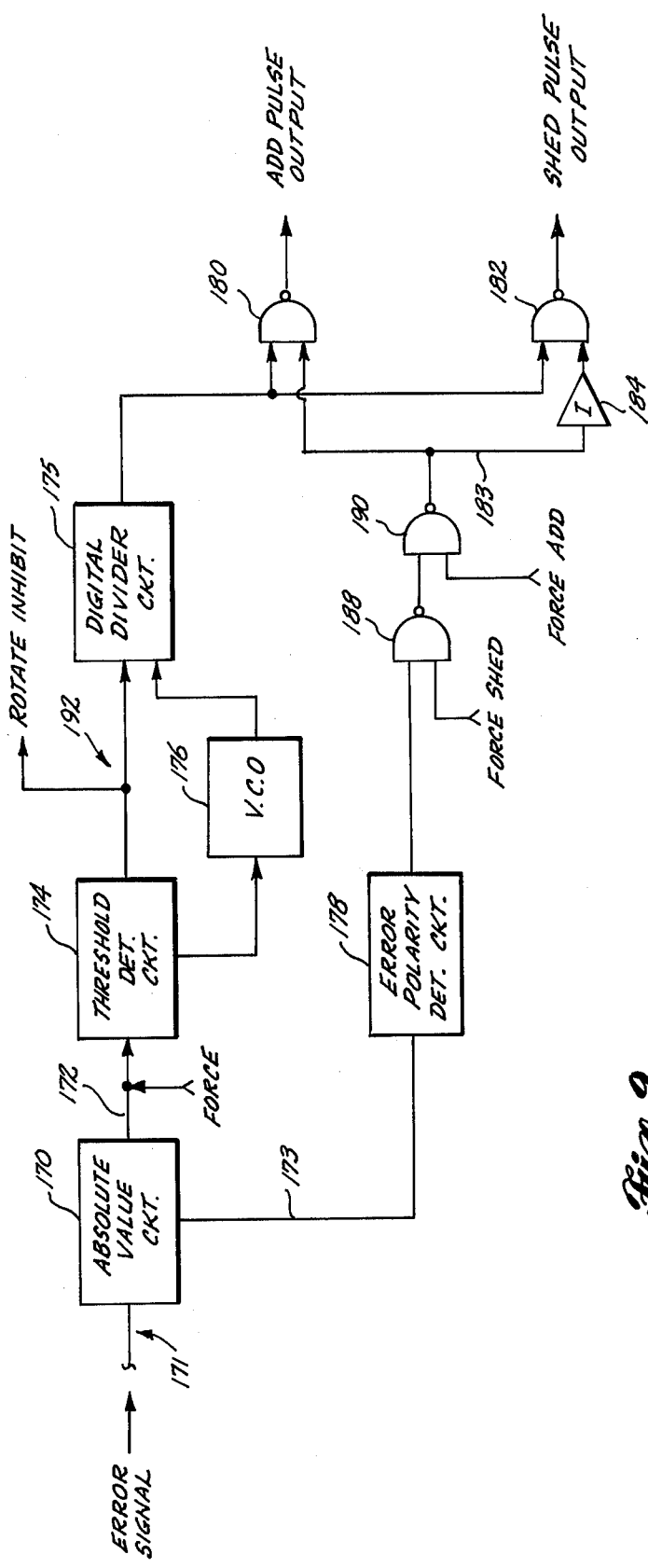
FIG. 9 shows a combined block and schematic diagram of a portion of an add/shed signal generating circuit modified for use with the alternative embodiment of the load control circuit that is shown in FIGS. 6 and 8.

Minimum/Maximum Select Circuit for R-Loads (FIGS. 8 & 9)

A Min./max. circuit 110 can be incorporated in circuit 11' as depicted in FIG. 6 above to form a preferred alternative embodiment of the load control circuit for enabling the selection of minimum and maximum numbers of R-loads that can be shed in response to the add/shed pulse generating circuit 14 of FIG. 1. The minimum setting requires a minimum number of the R-loads be turned OFF regardless of the number of add commands that have been or are being produced by generating circuit 14. This serves as an arbitrary limit on the amount of power consumed by the rotate loads. Conversely, the maximum setting establishes a maximum number of R-loads that can be turned OFF, irrespective of the number of shed commands produced by circuit 14, and thus for example may be used to maintain a minimum number of hallway lights ON for safe, minimal illumination.

With reference to FIG. 8, circuit 110 includes a binary counter 111 having a pulse-counting input 112 connected through an inverter 113 to receive the succession of R-OFF pulses from the load state decode circuit through a NAND gate 114 when gate 114 is enabled by EXL($\overline{Q}$) being high. Counter 111 thus registers in binary form at its plurality of bit outputs 115, the number of R-loads that are OFF at the end of any given addressing cycle. Counter 111 is reset at a clear input 116 via inverter 117 by the output of a NAND gate 118 that has its inputs connected to CARRY B and EXL($\overline{Q}$) respectively. So long as EXL($\overline{Q}$) remains high, enabling gate 118, counter 111 will be cleared at the end of each addressing cycle by CARRY B. If the control circuit is in the process of executing a received add or shed command, then EXL($\overline{Q}$) will go low, disabling gate 118 and preventing counter 111 from being cleared until the command has been executed. In such case, it will be observed that the counter 111 will count up to the number of R-OFF loads and will hold that count during execution of a command and until execute circuit 34' has been reset.

The binary bit outputs 115 from counter 111 are fed in parallel to a minimum R-OFF comparator circuit 120 and a maximum R-OFF comparator circuit 121. Circuit 120 includes a binary comparator 122 having one set of inputs connected to outputs 115 of counter 111 and another set of inputs connected to receive a Rmin.(-OFF) binary reference signal set on a bank of manually controllable switches included in a minimum reference circuit 123. A bank of manually controllable switches are divided into a first set 124a–124b and a second set 125a–125b. These switches are connected in pairs, one from each set through diodes 126 to a separate one of the four reference inputs 127 of comparator 122. In particular the cathodes of each pair of diodes 126 are connected to a separate binary input of comparator 122 and to one end of a load resistor 127 the other end of which is connected to ground. The two separate sets of switches 124a–124d and 125a–125d are selectively enabled by a day-night selection circuit 128, that includes a switch 129 which may be either manually controlled or automatically controlled (such as by a 24-hour clock) and an inverter 130 that has its input connected to switch 129 to form complementary logic outputs 131 and 132 that are switched between mutually exclusive high and low logic levels by switch 129. The set of switches 124a–124d are jointly connected to output 131 of circuit 128 and are enabled by switch 129 being disposed in the day (D) position wherein output 131 is at a logic high level, allowing a current to flow from a positive source through the plurality of diodes 126 to develop voltages over the load resistors 127 when switches 124a–124d are closed. By selective closure of these switches, a binary number representing Rmin.(-OFF) can be set for establishing an Rmin.(OFF) reference. Similarly, with switch 129 in the night (N) position, the output 132 of circuit 128 is at a logic high, thereby enabling the set of switches 125a–125d and disabling the set of switches 124a–124d. Thus in the night mode of circuit 128, one or more of switches 125a–125d may be closed to set an Rmin.(OFF) reference at inputs 127 of comparator 122. Of course the above-mentioned day and night periods are merely used as an example, and it will be appreciated that the varying conditions under which circuit 128 is switched between its two available modes will depend upon each individual installation.

Circuit 113 is identical to circuit 123 and includes two sets of switches, a plurality of diodes and load resistors all connected together as above described for setting an R max. (OFF) reference signal at the inputs 135 of a comparator 136 forming part of R-OFF maximum comparison circuit 121.

Decoding of the various combinations of output conditions developed by comparators 122 and 136 is performed by logic circuitry 140 including NOR gates 141, 142 and 143, inverters 144, 145, 152 and 162, NAND gates 146 and 161, and latches 147 and 148 and AND gate 163.

FIG. 9 shows a portion of the add/shed signal generating circuit 14 of the type disclosed in the above-identified copending application Ser. No. 707,566, modified for cooperation with the load control circuit 11' of FIG. 6 when provided with the Min./Max. circuit 110 of FIG. 8. As described in such copending application, an absolute value circuit 170 responds to an error signal at 171 and produces a constant polarity signal at output 172 having a level representing the magnitude of the error signal and produces a signal at output 173 that represents the direction in which the error occurs. The error signal is produced by a comparison of a signal representing the measured rate of power and a reference. Threshold detection circuit 174, digital divider circuit 175 and voltage controlled oscillator 176 co-function in response to output 172 to supply pulses to one input each of add and shed NAND gates 180 and 182, respectively, when a threshold magnitude of the error signal has been detected by circuit 174. An error polarity detection circuit 178 responds to the output 173 from circuit 170 for enabling one or the other of gates 180 and 182 via connections 183 and inverter 184 depending on the direction in which the error occurs.

In accordance with the modified construction of circuit 14, a pair of serially cascaded NAND gates 188 and 190 are connected in series with the signal path between circuit 178 and connection 183 for alternately enabling either gate 180 for a FORCE ADD condition or gate 182 through inverter 184 for FORCE SHED condition. A FORCE signal developed at the output of NAND gate 161 (FIG. 8) under conditions described herein is applied to the input of threshold detection circuit 174 as shown in FIG. 9 for forcing 174 to generate pulse signals at the output of circuit 175, where such pulses are selectively passed by gates 180 and 812 pursuant to the above-described enabling by gates 188 and 190.

In general, circuitry 140 (FIG. 8) functions to detect a condition at comparator 122 in which the number of OFF R-loads equals the setting of Rmin.(OFF) and thereupon disables any further adding of R-loads. Additionally, if a number of R-loads that are OFF is less than Rmin.(OFF), logic circuitry 140 detects this condition and produces a FORCE SHED signal that serves to shed the excess number of R-ON loads.

Circuitry 140 detects a condition at comparator 136 in which the R-OFF loads equals the R max. (OFF) and produces a signal that disables further shedding of loads in response to a shed command at input 18'. Additionally, if the number of R-loads that are OFF exceeds the Rmax.(OFF) reference, a FORCE ADD signal is produced that forces the addition of R-loads to satisfy the Rmax.(OFF) reference.

NOR gate 141 has one of its inputs connected via inverter 144 to an output of a highest order bit decode NOR gate 150 that is connected to the highest order bit output of counter 111. The other input to gate 141 is connected to an output 150 of comparator 122 representing R-OFF>Rmin.(OFF), when the output 150 of comparator 122 goes high. NOR gate 141 thereby produces an output signal which when at a logic low represents the condition R-OFF > Rmin.(OFF) or represents that the highest order bit of counters 111, indicates that the number of R-OFF loads exceeds the range of comparator 122. The output of NOR gate 141 is connected to the second input of gate 804 of circuit 11'(FIG.6) to arm the third input of gate 802 for setting RAOL 801 when such output signal is at a logic low. If comparator 122 determines that R-OFF is equal to or less than R min., then the output 150 of comparator 122 will switch low, thereby producing a high logic level at the output of gate 141 which in turn disarms gate 802 via gate 804 of circuit 11'(FIG. 6) preventing RAOL from being set.

If for any reason the number of R-OFF loads becomes less than Rmin.(OFF), an output 151 of comparator 122 goes high and causes a latch 147 to be set at CARRY A via a NAND gate 146 that has been previously armed by a high logic level at the output of gate 150. Latch 147, when set, produces a FORCE SHED signal at the $\bar{Q}$ output of latch 147 that together with the above-described FORCE signal causes circuit 14 (FIG. 1) to produce one or more shed pulses at input 18 of circuit 11 for increasing the number of R-OFF loads to equal Rmin.(OFF).

Maximum comparator 136 causes NOR gate 142 to produce a logic high level signal at the output thereof when R-OFF<Rmax.(OFF) which is inverted by inverter 152 to a logic low and is connected to a second input of gate 805 of circuit 11'(FIG. 6) for arming the second input of gate 803 when R-OFF<Rmax.(OFF). So long as gate 803 is enabled by the output of gate 805, gate 803 can respond to the conditions described above to set RAOL. If however, output 155 of comparator 136 at its output 155 goes to a low logic level, indicating that R-OFF is no longer less than Rmax.(OFF), this switches the output of inverter 152 to a logic high thereby disabling gate 803 and preventing RAOL from being set which in turn blocks the further addition of R-loads to the ON state.

Both gates 804 and 805 receive RIL($\bar{Q}$) for overriding the disabling logic functions R-OFF> Rmin. and R-OFF< Rmax. during an auto-rotate action since the auto-rotate action does not result in a net change in the number of R-OFF loads.

If the number of R-OFF loads becomes greater than Rmax.(OFF) under the circumstances described above, then an output 156 from comparator 136 becomes high and forces the output of NOR gate 143 low. The other input of gate 143 responds to the highest order bit of counter 111 to take care of the condition in which a large number of R-OFF loads exceed the range of comparator 136 forcing the output of NOR gate 143 low under such conditions. The low output sets latch 148 and produces a FORCE ADD signal that forces signal generating circuit 14 (FIG. 9) to apply one or more add pulses to input 16' of circuit 11' for effecting the addition of a sufficient number of R-loads to the ON state to satisfy the Rmax.(OFF) setting at comparator 136.

Concurrently with the operation of either latch 147 to force a shed command or latch 148 to force an add command, the $\overline{Q}$ outputs of the latches are connected to an F-load disabling logic circuit 160 that produces the output $\overline{RIL(Q)} + \overline{FORCE}$ for preventing add detection logic circuit 36' and downcount shed circuit 82 of circuit 11' (FIG. 6) from, respectively, adding one of the OFF F-loads and shedding one of the ON F-loads during the FORCE ADD and FORCE SHED functions of latches 148 and 147. For this purpose NAND gate 161 of circuit 160 has its two inputs separately connected to the ($\overline{Q}$) outputs of latches 147 and 148 to produce at the output of gate 161, a logic high when either latch 147 or latch 148 is switched to the set state. The output of gate 161 is inverted by inverter 162 and connected to one of two inputs of AND gate 163. The other input of gate 163 receives RIL($\overline{Q}$).

In response to the output of AND gate 163, the set of conditions at 36a' of circuit 36' (FIG. 6) is incapable of being satisfied during either RIL($\overline{Q}$) being high or FORCE being high. This prevents the add command received pursuant to a set state of latch 148 (FIG. 8) from being satisfied when an F-OFF signal is received at the gate of circuit 36' that detects the set of conditions 36a' and either a FORCE action or an auto-rotate action is taking place. Similarly, the $\overline{RIL(Q)} + \overline{FORCE}$ applied to the third input of gate 823 prevents DCSL 821 (FIG. 6) from being reset in response to an F-ON signal during the response of circuit 11' to a shed command forced by latch 147 under the above-mentioned alternative actions.

Circuit 14 as shown in FIG. 9 also illustrates the manner in which a Rotate Inhibit signal is derived from an output 192 of circuit 174 for application to auto-rotate timer circuit 86 for inhibiting auto-rotation during the generation of add and shed command signals by circuit 14 either pursuant to the above-described FORCE action or pursuant to power monitoring unit 12 (FIG. 1).

It will be appreciated that the foregoing is a detailed description of certain particular and illustrative embodiments of the invention and alternative embodiments of the principles taught herein and set forth in the following claims will be recognized by persons skilled in this art and accordingly such claims are to be given an interpretation that embraces equivalent means and methods to the hereinabove disclosed embodiments.

What I claim is:

1. A circuit for controlling the the "on/off" states of each of a plurality of electrical loads in response to power monitoring and signal generating circuit means that monitors the electrical power delivered to the "on" loads and produces an add control signal commanding the addition of one or more of the loads when power consumption is to be increased and produces a shed control signal commanding the shedding of one or more of said plurality of loads when such power consumption is to be decreased, comprising:

a plurality of individually addressable load control latch means, each having a load-off state and a load-on state, said plurality of load control latch means having a common data input means to which each of said load control latch means is individually responsive when it is addressed, each of said plurality of loads being adapted for control by a separate one of said load control latch means so that when each of said latch means is in its load-off state the load controlled thereby is "off", and when each of said latch means is in its load-on state, the load controlled thereby is "on";

address generating means for generating a succession of address signals, each such signal being effective to address a separate one of said plurality of load control latch means;

multiplexing means responsive to said succession of address signals produced by said address generator means so as to be synchronously operated with the addressing of said load control latch means, said multiplexing means having a plurality of inputs each of which is connected to a separate one of said plurality of load control latch means, said multiplexing means having a common output at which a signal is produced indicating the state of that one of said load control latch means then being addressed by said counter means;

add detection logic circuit means for detecting concurrence of a first set of conditions comprising the occurrence of the add control signal and the occurrence of a signal at said output of said multiplexing means indicating that the one of said load control latch means then being addressed is in its load-off state;

shed logic detection means for detecting concurrence of a second set of conditions comprising the occurrence of the shed control signal and a signal at said output of said multiplexing means indicating that the one of said load control latch means then being addressed is in its load-on state; and means connecting said add logic detection means and said shed logic detection means to said data input means of said plurality of load control latch means for responding to the detection by said add logic detection means of the concurrence of said first set of conditions to switch that one of said load control latch means then being addressed to said load-on state, and for responding to the detection by said shed logic detection means of the concurrence of said second set of conditions to switch that one of said load control latch means then being addressed to said load-off state.

2. The circuit set forth in claim 1, wherein said add and shed control signals are in the form of pulses, each add pulse signal commanding that one load be added and each shed pulse signal commanding that one load be shed, and further comprising:

add latch means having first and second states, said add latch means when in its first state being responsive to said add control signal to assume its second state;

shed latch means having first and second states, said shed latch means when in its first state being responsive to said shed control signal to assume its second state;

said add detection logic means being connected to said add latch means and being responsive to said occurrence of said add control signal by responding to said add latch means being in its second state;

said shed detection logic means being connected to said shed latch means and being responsive to said occurrence of said shed control signal by responding to said shed latch means;

add latch reset means for resetting said add latch means from its second state to its first state in response to said add logic detection means detecting said concurrence of said first set of conditions; and shed latch reset means for resetting said shed latch means from its second state to its first state in response to said shed logic detection means detecting said concurrence of said second set of conditions.

3. The circuit of claim 2 wherein said address generating means includes means for cyclically generating said succession of address signals, and further comprises execute logic circuit means connected to said add and shed latch means and to said add and shed detection logic means and to said address generating means, said execute logic circuit means preventing said add and shed detection logic means from responding to said add and shed latch means being in their second states until the beginning of a cycle of said address generating means.

4. The circuit of claim 1 for controlling the "on/off" states of the plurality of loads in a predetermined fixed priority sequence, wherein:
said address generating means includes means for cyclically generating said succession of address signals and means for enabling said address generating means to selectively assume forward and reverse directions of operation in which said address signals are generated in a forward direction of succession and a reverse direction of succession, respectively; and
direction control circuit means for disposing said address generating means in said forward direction of operation in response to said add control signal and for disposing said address generating means in its reverse direction of operation in response to said shed control signal, whereby the plurality of loads are added in response to the add control signal in a sequence determined by the forward direction of succession of said address signals and are shed in response to the second control signal in a sequence determined by the reverse direction of succession of said address signals.

5. The circuit of claim 1 for controlling the "on/off" states of the plurality of electrical loads in which available electrical power is to be distributed to the "on" loads on a rotated basis, and further comprising:
logic circuit means for operating said address generating means and said add and shed detection logic circuit means so as to enable said add detection logic circuit means to detect the concurrence of said first set of conditions when that one of said load control latch means is addressed that had been the earliest to be switched to its load-off state and so as to enable said shed logic detection means to detect the concurrence of said second set of conditions when that one of said load control latch means is addressed that had been the earliest to be switched to its load-on state.

6. The circuit of claim 5, wherein said logic circuit means comprises a last load state logic circuit means responsive to said output of said multiplexing means for memorizing the state of the last one of said load control latch means that has been addressed, said last load state logic circuit means being effective to enable said add detection logic circuit means to detect the concurrence of said first set of conditions when the first one of said control latch means that is addressed after at least one of said load control latch means that is in its load-on state has been addressed or when all of said load control latch means are in the load-off states, and said last load state logic circuit means being effective to enable said shed detection logic circuit means for detecting the concurrence of said second set of conditions when the first one of said load control latch means that is addressed after at least one of said load control latch means that is in its load-off state has been addressed or when all of said load control latch means are in the load-on states.

7. The circuit of claim 5, wherein said logic circuit means comprises:
address memory circuit means for memorizing the address signal for the last load control latch means that has been switched between its states; and
means responsive to the alternative conditions of either all of said load control latch means being in their load-on states or all of said load control latch means being in their load-off states for causing said address generating means to commence generating said address signals with that address signal that has been memorized by said address memory circuit means.

8. The circuit of claim 1 for controlling one group of the plurality of loads as a first-type of loads and for controlling another group of the plurality of loads as a second-type of loads, the group of first-type loads having a different predetermined "on/off" switching sequence in response to said first and second control signals than that of the group of second-type loads, and further comprising:
load-type selection and decoding circuit means responsive to said address signals from said address generating means for enabling each of said plurality of load control latch means to be selected for operating the load controlled thereby as a first-type or as a second-type of load, said load-type selection and decoding circuit means being responsive to each said address signal to produce a signal synchronously therewith indicating the selected type of the load controlled by the load control latch means then being addressed;
mode determining circuit means responsive to said load-type selection and decoding circuit means and to said multiplexing means and having a first electrical condition indicating that said add and shed control signals are to act on one of the group of loads of the first-type and having a second electrical condition indicating that said add and shed control signals are to act on one of the group of loads of the second-type;
said add and shed detection logic circuit means including logic means for enabling the detection of concurrence of said first and second sets of conditions, respectively, when said load-type selection and decoding circuit means produces a signal indicating that the addressed load-control latch means controls one of the loads of the first-type and said mode determining circuit means is in its first electrical condition and when said load type selection and decoding circuit means produces a signal indicating that the addressed load control latch means controls one of the loads of the second-type and said mode determining circuit means is in its second electrical condition.

9. The circuit of claim 8 for controlling the group of first-type loads on a rotated switching sequence so that available electrical power is distributed to the "on" loads on a non-priority time sharing basis, and further comprising:
logic circuit means for operating said address generating means and said add and shed detection logic circuit means so as to enable said add detection logic circuit means to detect the concurrence of said first set of conditions when that one of said load control latch means is addressed that had been the earliest to be switched to its load-off state and so as to enable said shed logic detection means to detect the concurrence of said second set of conditions when that one of said load control latch means is addressed that had been the earliest to be switched to its load-on state.

10. The circuit of claim 9 for controlling the group of second-type loads on a fixed priority switching sequence, and further comprising:
   logic circuit means for operating said address generating means in forward and reverse directions of address signal succession in response to said add and shed control signals, respectively, so as to enable said add detection logic circuit means to detect the concurrence of said first set of conditions when said address generating means is in said forward direction of address signal succession and so as to enable said shed detection logic circuit means to detect the concurrence of said second set of conditions when said address generating means is in said reverse direction of address signal succession.

11. The circuit of claim 1 for controlling the "on/off" states of the plurality of loads on a rotational basis, and further comprising:
   simulated add and shed control signal generating means for generating control signals that simulate the add and shed control signals for causing one of said load control latch means to be switched to its load-on state and another of said load control latch means to be switched to its load-off state thereby rotating the "on/off" states of the plurality of loads; and
   counting means responsive to said multiplexing means for counting the number of said load control latch means that in their load-off state, said simulated control signal generating means being responsive to said counting means for generating said control signals that simulate the add and shed control signals when a predetermined number of said load control latch means in their load-off state have been counted.

12. The circuit of claim 1 for controlling the plurality of loads so that the number of such loads that can be switched to the "on" state has a preset limit, and further comprising:
   add inhibiting logic circuit means that when operative prevents said add detection logic circuit from detecting said concurrence of said first set of conditions; and
   counting circuit means for counting the number of said load control latch means which when addressed are in predetermined one of their states, said add inhibiting logic circuit means being normally inoperative and being responsive to said counting circuit means to become operative when said counting circuit means counts a predetermined number of said load control latch means that are in said predetermined one of their states.

13. The circuit of claim 1 for controlling the plurality of loads so that the number of such loads that can be switched to the "off" state has a preset limit, and further comprising:
   shed inhibiting logic circuit means that when operative prevents said shed detection logic circuit means from detecting said concurrence of said second set of conditions; and
   counting circuit means for counting the number of said load control latch means then when addressed are in a predetermined one of their states, said shed inhibiting logic circuit means being normally inoperative and being responsive to said counting circuit means to become operative when said counting circuit means counts a predetermined number of said load control latch means in said predetermined one of their states.

14. The circuit of claim 10, wherein said mode determining means includes group priority selection means for establishing an intergroup priority in the adding and shedding of the ends of the first-type group with respect to the loads of the second-type group.

15. The circuit of claim 10 wherein said address generating means has a forward operating direction in which said address signals are generated in a predetermined sequence and a reverse operating direction in which said address signals are generated in the reverse of said sequence, and wherein said load-type selector and decode means is predisposed so that all of the first-type of loads are controlled by load control latch means addressed by consecutive address signals and so that said second-type loads are controlled by the remaining load control latch means, and wherein said mode determining means comprise a rotate action only circuit means and a down-count shed circuit means for controlling said add and shed detection logic circuit means and for controlling the operating direction of said address generating means such that said second-type loads are added in the order in which their load control latch means are addressed in said predetermined sequence and are shed in the reverse of said order, and such that said first-type loads are added only after all the second-type loads that are controlled by those of said load control latches addressed by address signals that precede said consecutive address signals in said sequence have been added and are shed only after all the second-type loads that are controlled by those of said load control latches addressed by address signals that follow said consecutive address signals have been shed.

16. A method of automatically controlling the "on/off" states of each of a plurality of electrical loads in response to the steps of monitoring the level of the electrical power delivered to the "on" loads, producing an add control signal for commanding the addition of one of the plurality of loads when power consumption is to be increased, and producing a shed control signal for commanding the shedding of one of the plurality of loads when power consumption is to be decreased, comprising the steps of:
   controlling the "on/off" states of each of the plurality of electrical loads by a corresponding plurality of individually addressable electrical latches, one for each load, wherein each said latch, when addressed, is capable of being disposed in either a load-off state in which the load controlled thereby is switched "off", or a load-on state in which the load controlled thereby is switched "on";
   repetitively generating a predetermined sequence of latch-addressing signals and applying said signals to said latches so as to individually address said latches in a given sequence;
   sensing the state of each of said latches at a time when each such latch is being addressed by a corresponding one of said latch-addressing signals;
   detecting the concurrence of said add control signal and the sensing of a load-off state of one of said latches and in response thereto switching such latch to its load-on state; and detecting the concurrence of said shed control signal and the sensing of a load-on state of one of said latches and in response thereto switching such latch to its load-off state.

17. The method of claim 16, further comprising the step of automatically changing said predetermined sequence in which said latch-addressing signals are generated to control the sequence in which the loads are switched between their "on" and "off" states in response to said add and shed control signals.

18. The method of claim 17 wherein said step of automatically changing said predetermined sequence comprises the step of selectively reversing said predetermined sequence.

19. The method of claim 17 wherein said step of automatically changing said predetermined sequence comprises the step of selectively skipping certain of said latch-addressing signals in said predetermined sequence.

* * * * *

UNITED STATES PATENT AND TRADEMARK OFFICE
CERTIFICATE OF CORRECTION

PATENT NO. : 4,064,485
DATED : December 20, 1977
INVENTOR(S) : Warren L. Leyde

It is certified that error appears in the above-identified patent and that said Letters Patent are hereby corrected as shown below:

Col. 3, line 2, delete "switchng" and insert —switching—.

Col. 6, line 44, delete "and U.S. Pat. No. 4,034,22" and insert —(now Pat. No. 4,034,233) and—.

Col. 9, line 41, delete "an" and insert —and—.

Col. 11, line 31, delete the comma after "351" and insert a period.

Col. 12, line 35, delete "Thhe" and insert —The—.

Col. 15, line 32, delete "or" and insert —of—.

Col. 16, line 7, delete "in" and insert —is—.

UNITED STATES PATENT AND TRADEMARK OFFICE
CERTIFICATE OF CORRECTION

PATENT NO. : 4,064,485
DATED : December 20, 1977
INVENTOR(S) : Warren L. Leyde

It is certified that error appears in the above-identified patent and that said Letters Patent are hereby corrected as shown below:

(continued)

Col. 19, line 18, delete "on" and insert —one—.

Col. 19, line 23, delete "is" and insert —in—.

Col. 25, line 5, delete "time" and insert —timing—.

Col. 28, line 21, delete "had" and insert —has—.

Col. 28, line 32, "AIL(Q) EXL(Q)" should be —AIL(Q)·EXL(Q)—.

Col. 28, line 42, delete "downward" and insert —downcount—.

Col. 29, line 18, delete "desired" and insert —described—.

Col. 35, line 34, "set thereby, shedding" should be —set state, thereby shedding—.

Col. 35, line 35, delete "#$_2$" and insert —$\emptyset_2$—.

Col. 37, line 48, after "forcing" insert —circuit—.

UNITED STATES PATENT OFFICE
CERTIFICATE OF CORRECTION

Patent No. 4,064,485　　　　　　　　　　Dated December 20, 1977

Inventor(s) Warren L. Leyde

It is certified that error appears in the above-identified patent and that said Letters Patent are hereby corrected as shown below:

Col. 38, line 10, delete "counters" and insert --counter--.

Col. 38, line 44, delete "at its output 155"

Signed and Sealed this

Twenty-fifth Day of April 1978

[SEAL]

Attest:

RUTH C. MASON  
Attesting Officer

LUTRELLE F. PARKER  
Acting Commissioner of Patents and Trademarks